(12) United States Patent
Nakamura

(10) Patent No.: US 6,442,703 B1
(45) Date of Patent: Aug. 27, 2002

(54) CLOCK REGENERATOR

(75) Inventor: Satoshi Nakamura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/373,531

(22) Filed: Aug. 12, 1999

(30) Foreign Application Priority Data

Aug. 12, 1998  (JP) .......................................... 10-227780

(51) Int. Cl.⁷ ................................................ G06F 1/04
(52) U.S. Cl. ..................................... 713/500; 713/400
(58) Field of Search .............................. 713/500–503, 713/400, 401

(56) References Cited

U.S. PATENT DOCUMENTS

| | | | |
|---|---|---|---|
| 4,069,462 A | | 1/1978 | Dunn |
| 4,415,984 A | * | 11/1983 | Gryger et al. ............... 713/401 |
| 5,410,571 A | | 4/1995 | Yonekawa et al. |
| 5,623,649 A | * | 4/1997 | Verdun ........................ 713/503 |
| 5,692,166 A | * | 11/1997 | Milhizer et al. ............ 713/400 |
| 5,786,733 A | | 7/1998 | Yamaguchi |
| 6,037,813 A | * | 3/2000 | Eto et al. ..................... 327/156 |
| 6,108,793 A | * | 8/2000 | Fujii et al. ................... 713/400 |

FOREIGN PATENT DOCUMENTS

| | | |
|---|---|---|
| JP | 63-249976 | 10/1988 |
| JP | 3-297221 | 12/1991 |
| JP | 4-215338 | 8/1992 |
| JP | 9-93090 | 4/1997 |
| JP | 10-163864 | 6/1998 |
| JP | 11-41222 | 2/1999 |
| WO | 96/17435 | 6/1996 |

OTHER PUBLICATIONS

Walker, et al:, "A 2.448–GBIT/S Silicon Bipolar Clock and Dat Recovery Circuit for Sonet Fiber–Optic Communications Network" Hewlett–Packard Journel, Hewlett–Packard Co. Palo Alto, US vol. 48, No. 5, Dec. 01, 1997, pp. 111–119, XP000752705 p. 113, Line 1–p. 113, Line 20/Figure 1.

* cited by examiner

Primary Examiner—Thomas M. Heckler
(74) Attorney, Agent, or Firm—Katten Muchin Zavis Rosenman

(57) ABSTRACT

A clock regenerator capable of regenerating the clock signal in response to the inputted digital data, includes: the oscillating section (voltage generating circuit, voltage controlled oscillator), the first generating section (frequency divider, phase/frequency comparator) for generating the first comparison signal in response to the frequency difference between the reference signal and the clock signal, the second generating section (phase comparator) for generating the second comparison signal in response to the phase difference between the inputted digital data and the clock signal, the selector for outputting the first comparison signal of the first generating section or the second comparison signal of the second generating section to the oscillating section, and the synchronization detecting section for controlling the selector such that it selects the first comparison signal of the first generating section when the frequency difference between the reference signal and the clock signal is out of a predetermined range, and further controlling the selector such that it selects the second comparison signal of the second generating section when the frequency difference falls within a predetermined range.

14 Claims, 26 Drawing Sheets

CLOCK REGENERATOR

BACKGROUND OF THE INVENTION

1. Field of the Invention

The present invention relates to a clock regenerator for generating a clock, and more specifically to a clock regenerator for regenerating a clock from an inputted digital signal.

2. Description of the Related Art

For digital apparatuses such as communication apparatuses for processing digital signals there are known those to regenerate a clock required for the apparatus itself using input data received from a destination instrument and a recording medium. Japanese Laid-open Patent Application No. Sho63-249976 discloses as a clock extraction circuit such an apparatus to generate a clock.

As illustrated in FIG. 26, the aforementioned clock extraction circuit includes a gate 501, a phase comparator 502, an adder 503, a loop filter 504, a voltage controlled oscillator (hereinafter simply referred to as VCO) 505, a frequency divider 506, and a frequency comparator 507. The gate 501 of the clock extraction circuit interrupts a digital signal (an input data) with a dropout signal. The phase comparator 502 generates an output in response to a difference between phase of the digital signal inputted through the gate 501 and phase of the clock.

In contrast, the frequency comparator 507 generates an output in response to a difference between frequency of a reference signal and frequency of the clock. The adder 503 adds an output from the phase comparator 502 and an output from the frequency comparator 507. The loop filter 504 has a flat frequency characteristic between frequency f511 and f512, as illustrated in FIG. 27A. The loop filter 504 generates voltage in response to an addition result from the adder 503, which is outputted to the VCO 505. The VCO 503 has a frequency characteristic illustrated in FIG. 27B. The VCO 503 generates a signal having a frequency in response to the voltage applied from the loop filter 504. The frequency divider 506divides frequency of the signal generated by the VCO 505 to form the aforementioned clock. The clock extraction circuit thus generates the aforementioned clock in response to the aforementioned digital signal.

The foregoing prior art technique disclosed in the aforementioned Publication however suffers from the following difficulties. The adder 503 of the aforementioned clock extraction circuit is constructed with an analog circuit, and hence bad nonlinearity of the adder 503 affects on the addition result. Hereby, the addition result in response to a phase difference outputted from the phase comparator 502 and a frequency difference outputted from the frequency comparator 507 is prevented from being outputted from the adder 503, so that a clock responsive to the aforementioned digital signal is not regenerated.

Further, since the adder 503 is an analog circuit, and hence there is caused a difficulty that the adder 503 is formed with variations in its operation upon its manufacture, so that the aforementioned clock extraction circuit with uniform performance is not ensured.

As means to correct such difficulties with the prior art, there are known clock regenerators disclosed in Japanese Laid-open Patent Application Nos. Hei10-163864, Hei04-215338, and Hei11-41222. Each device disclosed in the above Publications is adapted such that it not only ensures a recovery clock having frequency and phase accurately in synchronism with input data without synchronizing with incorrect frequency upon recovering a clock from random data, but also it can rapidly return to a state where correct frequency and phase are in synchronism with the input data even when the synchronization becomes out of phase and phase and frequency of the recovery clock due to VCO are displaced from the input data.

However, in a clock recovery circuit used for main communication for example , there is required a specification, called jitter tolerance, in which even when input data has jitter and its frequency component fluctuates, the circuit must sufficiently follow up the input data. When the input data has jitter and its frequency component fluctuates, the recovery clock follows up the input data by changing its frequency. This does not mean that synchronization is out of phase, but means that the frequency merely changes to inevitably follow up the input data The device is however adapted such that it judges whether or not the frequency synchronization is out of phase with a fixed frequency taken as a reference. There happens accordingly a difficulty that it is judged in the course of the follow-up of the operation for the fluctuation of the input data that the frequency synchronization is out of phase, which might cause the required jitter tolerance not to be satisfied.

SUMMARY OF THE INVENTION

In view of the above, it is an object of the present invention to provide a clock regenerator capable of regenerating an accurate clock while securely following an input digital signal even when the signal fluctuates.

According to a first aspect of the present invention, there is provided a clock regenerator comprising:

an oscillating section for outputting a clock signal with a frequency in response to an inputted first or second comparison signal;

a first generating section for comparing the frequency of an inputted reference signal with that of the clock signal, and generating the first comparison signal in response to the frequency difference between the frequency of the inputted reference signal and that of the clock signal;

a second generating section for comparing the phase of a digital input data with that of the clock signal, and generating the second comparison signal in response to the phase difference between the phase of the digital input data and that of the clock signal;

a first changeover section for selecting either the first comparison signal fed from the first generating section or the second comparison signal fed from the second generating section, and outputting a selected signal to the oscillating section; and a controlling section for investigating whether or not a frequency difference between the frequency of the reference signal and that of the clock signal falls within a predetermined range, and controlling the first changeover section, when the frequency difference is outside the predetermined range, such that the first comparison signal generated by the first generating section is selected, while controlling the first changeover section, when the frequency difference falls within the predetermined range (different with the first predetermined range), such that the second comparison signal generated by the second generating section is selected.

According to a second aspect of the present invention, there is provided a clock regenerator comprising:

an oscillating section for outputting a clock signal with a frequency in response to an inputted first or second comparison signal;

a first generating section for comparing the frequency of an inputted reference signal with that of the clock signal, and generating the first comparison signal in response to the frequency difference between the frequency of the inputted reference signal and that of the clock signal;

a second generating section for comparing the phase of a digital input data with that of the clock signal, and generating the second comparison signal in response to the phase difference between the phase of the digital input data and that of the clock signal;

a first changeover section for selecting either the first comparison signal fed from the first generating section or the second comparison signal fed from the second generating section, and outputting a selected signal to the oscillating section; and a controlling section for investigating whether or not a frequency difference between the frequency of the reference signal and that of the clock signal falls within a first or a second predetermined range, and controlling the first changeover section when the frequency difference is outside the first predetermined range such that the first comparison signal generated by the first generating section is selected, while controlling the first changeover section when the frequency difference falls within the second predetermined range such that the second comparison signal generated by the second generating section is selected.

In the foregoing first and second aspects, a preferable mode is one wherein said oscillating section includes a voltage generating circuit for generating control voltage based upon said inputted first or second comparison signal and a voltage controlled oscillator for generating and outputting a clock signal with a frequency in response to said control voltage applied from said voltage generating circuit.

Also, a preferable mode is one wherein said controlling section investigates, based upon a comparison result of said first generating section, whether or not said frequency difference between the frequency of said reference signal and that of said clock signal falls within a predetermined range.

In addition, a preferable mode is one that wherein further comprises:

a correcting section for generating a corrected reference signal by means of matching the phase of a predetermined reference signal with a predetermined frequency to the phase of said clock signal fed from said oscillating section;

a second changeover section for selecting either said corrected reference signal fed from said correcting section or said predetermined reference signal, and thus outputting a selected signal as said reference signal to said first generating section; and said controlling section for controlling said second changeover section so as to select said predetermined reference signal when said frequency difference is out of said predetermined range, while controlling said second changeover section so as to select said corrected reference signal when said frequency difference falls within said predetermined range.

Further, a preferable mode is one wherein said first generating section compares the frequency of said clock signal obtained by dividing, using said frequency divider, the frequency of said clock signals fed from said oscillating section with that of said reference signal.

Furthermore, a preferable mode is one wherein said correcting section generates said corrected reference signal by means of matching the phase of said predetermined reference signal with said pre-determined frequency to the phase of said clock signal obtained by dividing, using said frequency divider, the frequency of said clock signals fed from said oscillating section.

According to a third aspect of the present invention, there is provided a clock regenerator comprising:

circuit section for generating a first comparison signal in response to the frequency difference between the frequency of an inputted reference signal and that of a clock signal so as to obtain said clock signal with the frequency in response to said first comparison signal, and thereafter generating a second comparison signal in response to the phase difference between a phase of digital input data and that of said clock signal so as to obtain said clock signal in response to said second comparison signal.

According to a fourth aspect of the present invention, there is provided a clock regenerator comprising:

circuit section for changing operation from clock synchronization due to frequency comparison to clock synchronization due to phase comparison when a frequency difference between the frequency of an inputted reference signal and that of a clock signal falls within a first predetermined range, while changing operation from clock synchronization due to said phase comparison to clock synchronization due to said frequency comparison when said frequency difference between the frequency of said inputted reference signal and that of said clock signal is out of a second predetermined range including said first predetermined range.

BRIEF DESCRIPTION OF THE DRAWINGS

The above and other objects, advantages and features of the present invention will be more apparent from the following description taken in conjunction with the accompanying drawings, in which:

FIG. 27 is views each illustrating frequency characteristics of a loop filter and a VCO used for the clock extraction circuit.

DETAILED DESCRIPTION OF THE PREFERRED EMBODIMENTS

The best modes for carrying out the present invention will be described in detail using embodiments of the present invention with reference to the accompanying drawings.

First Embodiment

Figure 1:
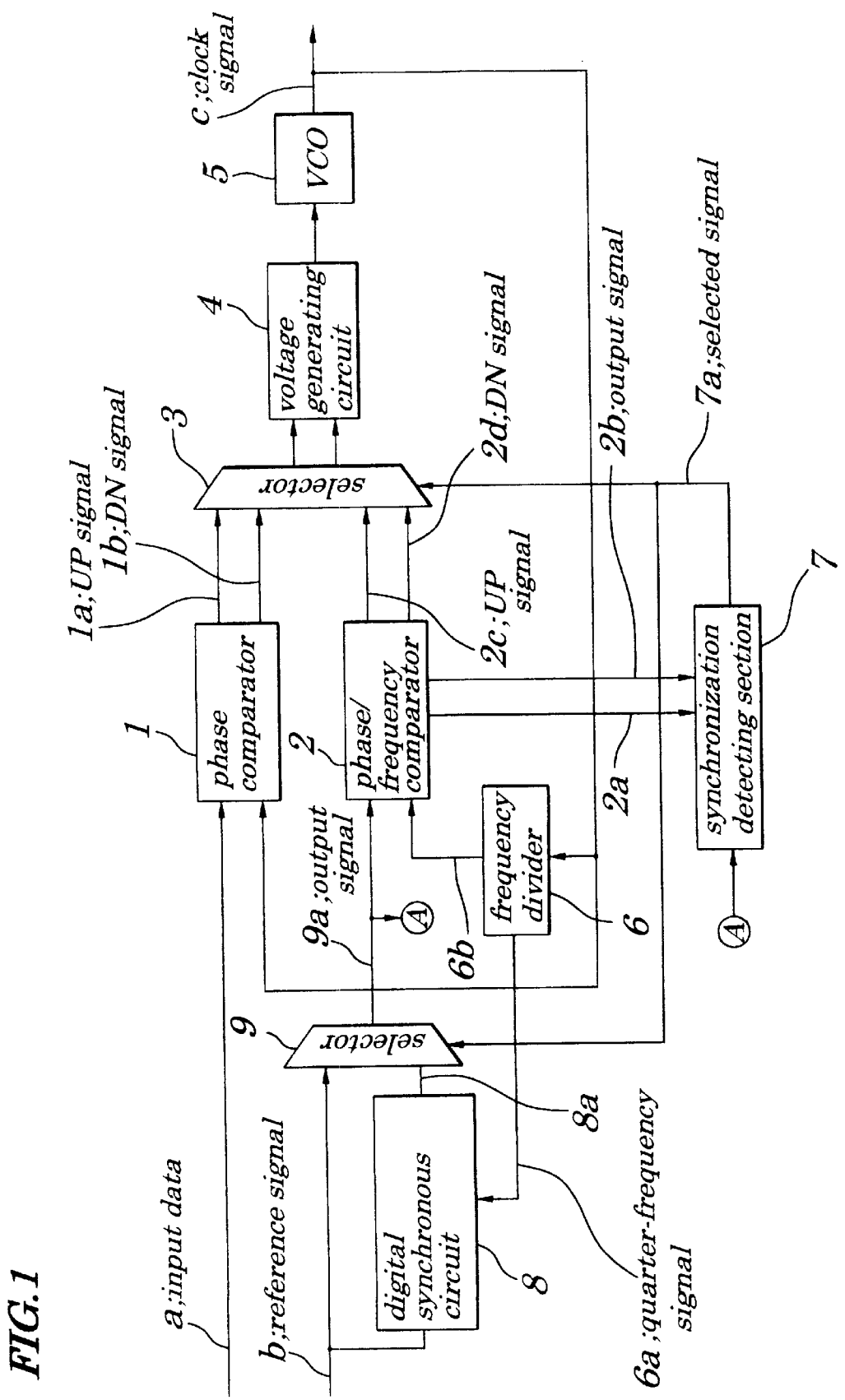
FIG. 1 is a block diagram schematically illustrating the construction of a clock regenerator according to a first preferred embodiment of the present invention.

As shown in FIG. 1, a clock regenerator uses as input data a an NRZ (Non Return Zero) signal of 622 Mbps for example to regenerate a clock signal C of 622 Mbps. The clock regenerator includes a phase comparator 1, a phase/frequency comparator 2, selectors 3, 9, a voltage generating circuit 4, a VCO (voltage controlled oscillator) 5, a frequency divider 6, a synchronization detecting section 7, and a digital synchronous circuit 8.

The VCO 5, when it receives the control voltage from the voltage generating circuit 4, generates a clock signal c with a frequency in response to the control voltage. The VCO 5 outputs the generated clock signal c to the outside, and further outputs the clock signal c to the phase comparator 1 and the frequency divider 6.

The frequency divider 6, when it receives the clock signal c from the VCO 5, divides the frequency of the clock signal c. The frequency divider 6 outputs a quarter-frequency signal (frequency quartered signal) 6a obtained by dividing the frequency of the clock signal c in quarters to the digital synchronous circuit 8, and further outputs an eighth-frequency signal (frequency divided by-eight signal) 6b obtained by dividing the frequency of the clock signal c in eighth to the phase/frequency comparator 2.

Figure 2:
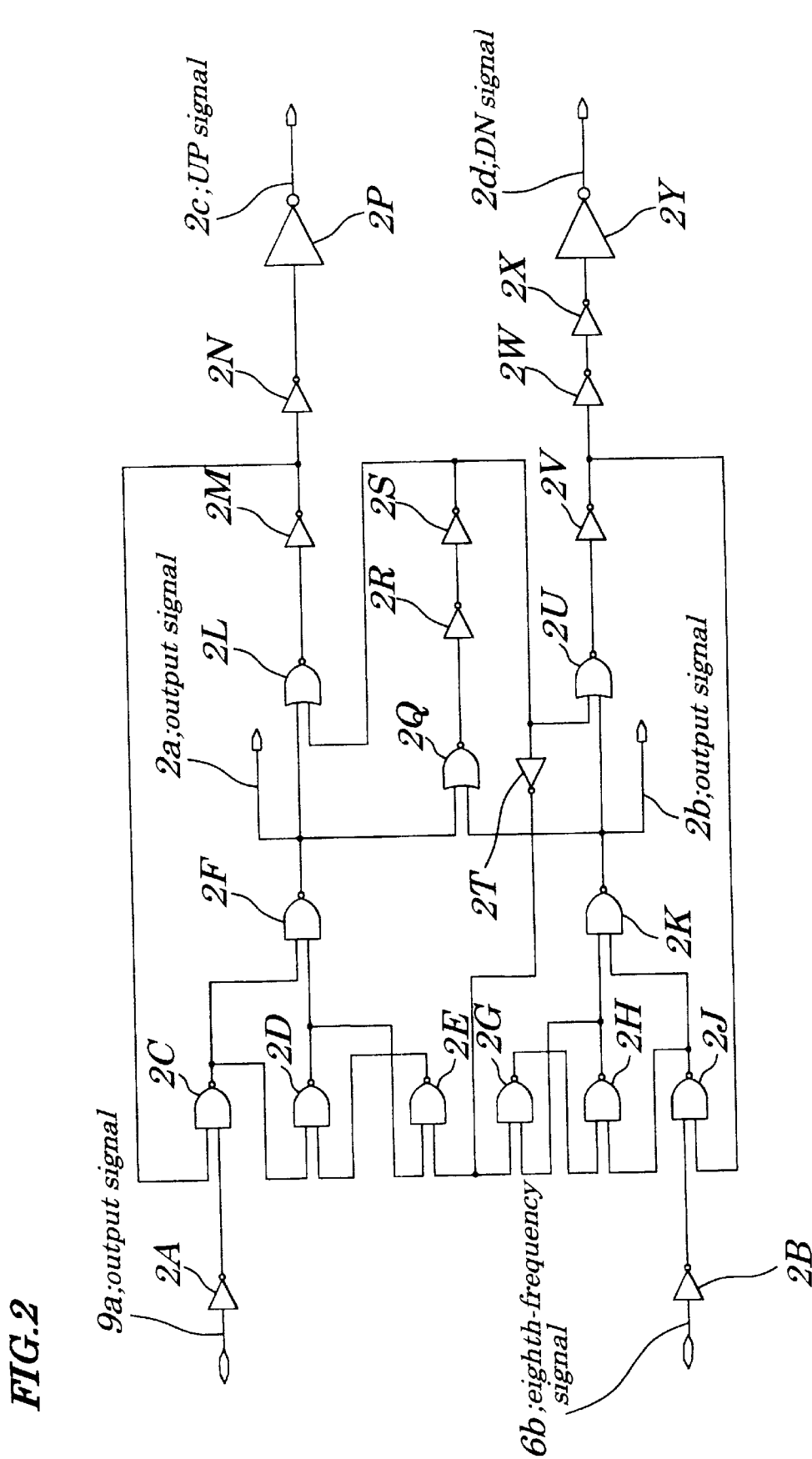
FIG. 2 is a circuit diagram exemplarily illustrating a phase/frequency/comparator used for the clock regenerator.

The phase/frequency comparator 2 compares frequency and phase of an output signal 9a outputted from the selector 9 with of the eighth-frequency signal 6b from the frequency divider 6. The output signal 9a is a reference signal that is used as a reference of the frequency. The phase/frequency comparator 2 generates output signals 2a, 2b, an UP signal 2c, and a DN signal 2d. FIG. 2 exemplarily illustrates the phase/frequency comparator 2.

The phase/frequency comparator 2 in FIG. 2 includes inverters 2A, 2B, 2M, 2N, 2P, 2R, 2S, 2T, 2V to 2Y, and gates 2C to 2H, 2J, 2K (hereinafter, each simply referred to as a NAND gate) each for calculating negation of a logical product, and gates 2L, 2Q, 2U (hereinafter, simply referred to as a NOR gate) for calculating negation of logical sum. In the phase/frequency comparator 2 in FIG. 2 a first flip flop comprises a NAND gate 2D and a NAND gate 2E, and a second flip flop comprises a NAND gate 2G and a NAND gate 2H. Further, a reset circuit comprises a NOR gate 2Q and inverters 2R, 2S.

An output signal 9a from the selector 9 is applied to the NAND gate 2C through the inverter 2A. The NAND gate 2C calculates negation of logical product between a previous output and the output signal 9a, and outputs a result to the NAND gate 2F. The NAND gate 2F calculates negation of logical product between an output from the first flip-flop and an output from the NAND gate 2C, and generates an output signal 2a.

The eighth-frequency signal 6b from the frequency divider 6 is applied to the NAND gate 2J through the inverter 2B. The NAND gate 2J calculates negation of a logical product between a previous output and the eighth-frequency signal 6b, and outputs a result to the NAND gate 2K. The NAND gate 2K calculates negation of a logical product between an output of the second flip-flop and an output from the NAND gate 2J, and provides an output signal 2b.

Figure 3:
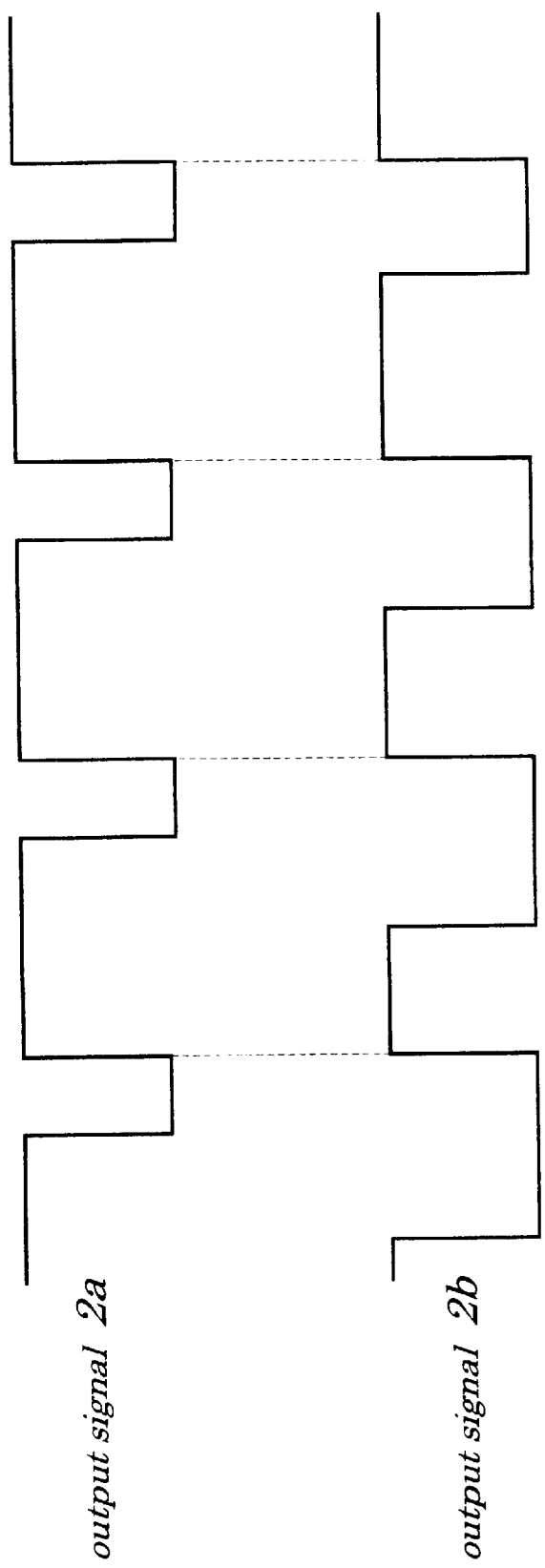
FIG. 3 is views each illustrating a waveform outputted from the phase/frequency comparator used for the clock regenerator.

FIG. 3 illustrates output signals 2a, 2b generated by the phase/frequency comparator 2. As illustrated in FIG. 3, the output signal 2a is generated on the basis of the output signal 9a, which signal 2a has a fixed duty ratio. The output signal 2b is generated on the basis of the eighth-frequency signal 6b, i.e., the clock signal c from the VCO 5, and the duty ratio is changed in response to the frequency difference between itself and the output signal 9a.

The phase/frequency comparator 2 indicates a monitoring result for the clock c with the output signals 2a, 2b. More specifically, the phase/frequency comparator 2 investigates frequency variations of the clock c based upon the output signal 9a, and the variations are represented by a change in a duty ratio of the output signals 2a, 2b. The phase/frequency comparator 2 outputs the output signals 2a, 2b generated as such is outputted to the synchronization detecting section 7.

In the phase/frequency comparator 2 in FIG. 2, the output signal 2a is outputted to the NOR gate 2L. The NOR gate 2L calculates negation of logical sum between a reset signal from the aforementioned reset circuit and the output signal 2a, and outputs a result to the inverter M. The inverter 2M calculates negation of a calculated result from the NOR gate 2L, and generates an UP signal. The UP signal is outputted to the NAND gate 2C and is outputted to the selector 3 as an UP signal 2c through the inverters 2N, 2P.

Further, the output signal 2b is outputted to the NOR gate 2U. The NOR gate 2U calculates negation of logical sum of the reset signal from the reset circuit and the output signal 2b, and outputs a result to the inverter 2V. The inverter 2V calculates negation of the result from the NOR gate 2U, and generates a DOWN signal (hereinafter, simply referred to as a DN signal).

The DN signal is outputted to the NAND gate 2J, and is outputted to the selector 3 as the DN signal 2d through the inverters 2W to 2Y.

Figure 4:
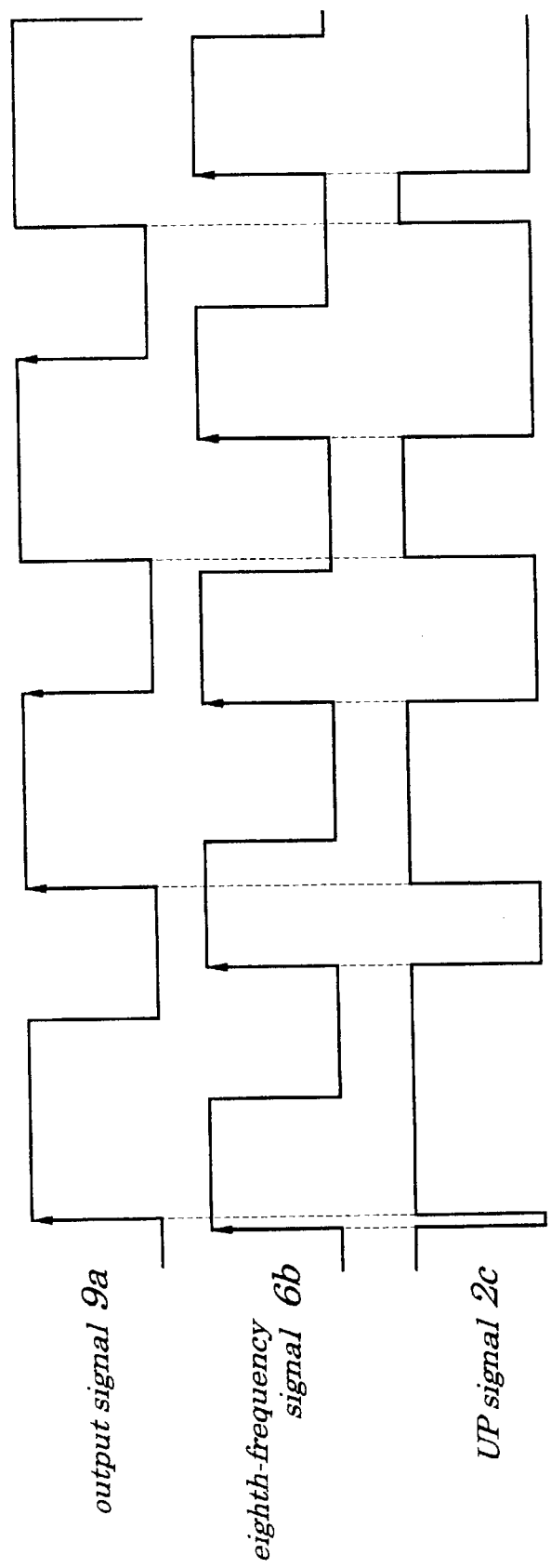
FIG. 4 is a view illustrating waveforms of an UP signal outputted from the phase/frequency comparator used for the clock regenerator.

The phase/frequency comparator 2 outputs the UP signal 2c and the DN signal 2d as described above. The UP signal 2c and the DN signal 2d outputted by the phase/frequency comparator 2 are as follows. When the frequency of the eighth-frequency signal 6b is lower than the output signal 9a inputted into the phase/frequency comparator 2, a pulse is generated upon building-up of the output signal 9a and the eighth-frequency signal 6b as illustrated in FIG. 4 to output the UP signal 2c.

During this the phase/frequency comparator 2 does not output the DN signal 2d.

Figure 5:
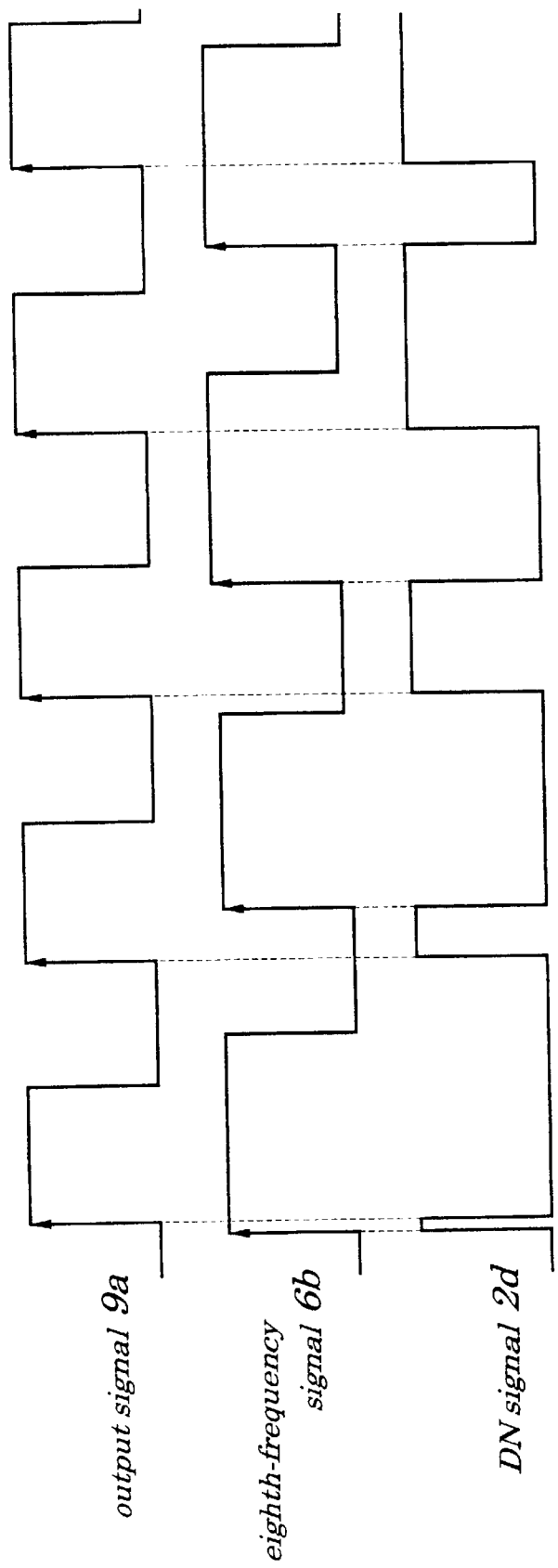
FIG. 5 is a view illustrating waveforms of a DN signal outputted from the phase/frequency comparator used for the clock regenerator.

When the eighth-frequency signal 6b is higher than the output signal 9a, a pulse is generated at a building-up edge of the eighth-frequency signal 6b and the output signal 9a as illustrated in FIG. 5 to output the DN signal 2d.

Figure 6:
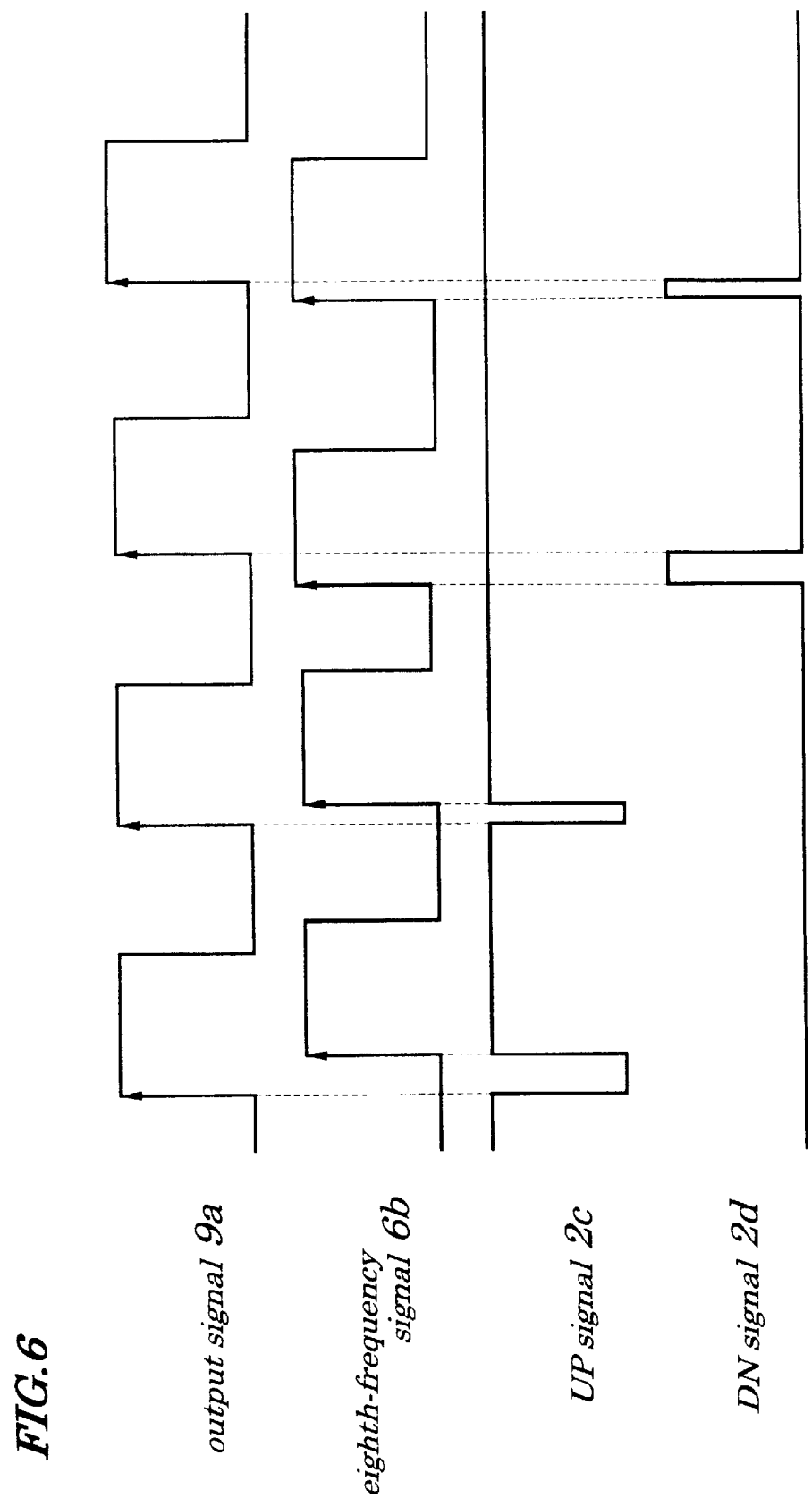
FIG. 6 is a view illustrating waveforms of the UP signal and the DN signal outputted from the phase/frequency comparator used for the clock regenerator.

During this the phase/frequency comparator 2 does not output the UP signal 2c. When after the frequency of the eighth-frequency signal 6b is coincident with the output signal 9a, the phase of the eighth-frequency signal 6b is delayed from the reference signal b, the phase/frequency comparator 2 outputs the UP signal 2c, while when the phase of the eighth-frequency signal 6b is advanced, it outputs the DN signal 2d, as illustrated in FIG. 6.

As the frequency of the eighth-frequency signal 6b approaches the output signal 9a, pulse widths of the UP signal 2c and the DN signal 2d are reduced, and if the frequencies of these two signals are coincident with each other, the phase/frequency comparator 2 does not output the UP signal 2c and the DN signal 2d. It is therefore proper to use the phase/frequency comparator 2 when a frequency difference or a phase difference between the output signal 9a and the eighth-frequency signal 6b is greater.

The selector 3 performs selection operation based upon a selected signal 7a from the synchronization detecting section 7. More specifically, when the selected signal 7a is a high level, the selector 3 outputs the UP signal la and the DN signal 1b from the phase comparator 1 to the voltage generating circuit 4. Hereby, the phase comparator 1 is associated with the generation of the clock c. When the selected signal 7a is a low level, the selector 3 outputs the UP signal 2c and the DN signal 2d from the phase/frequency comparator 2 to the voltage generating circuit 4. Hereby, the phase/frequency comparator 2 is associated with the generation of the clock signal c.

Figure 7:
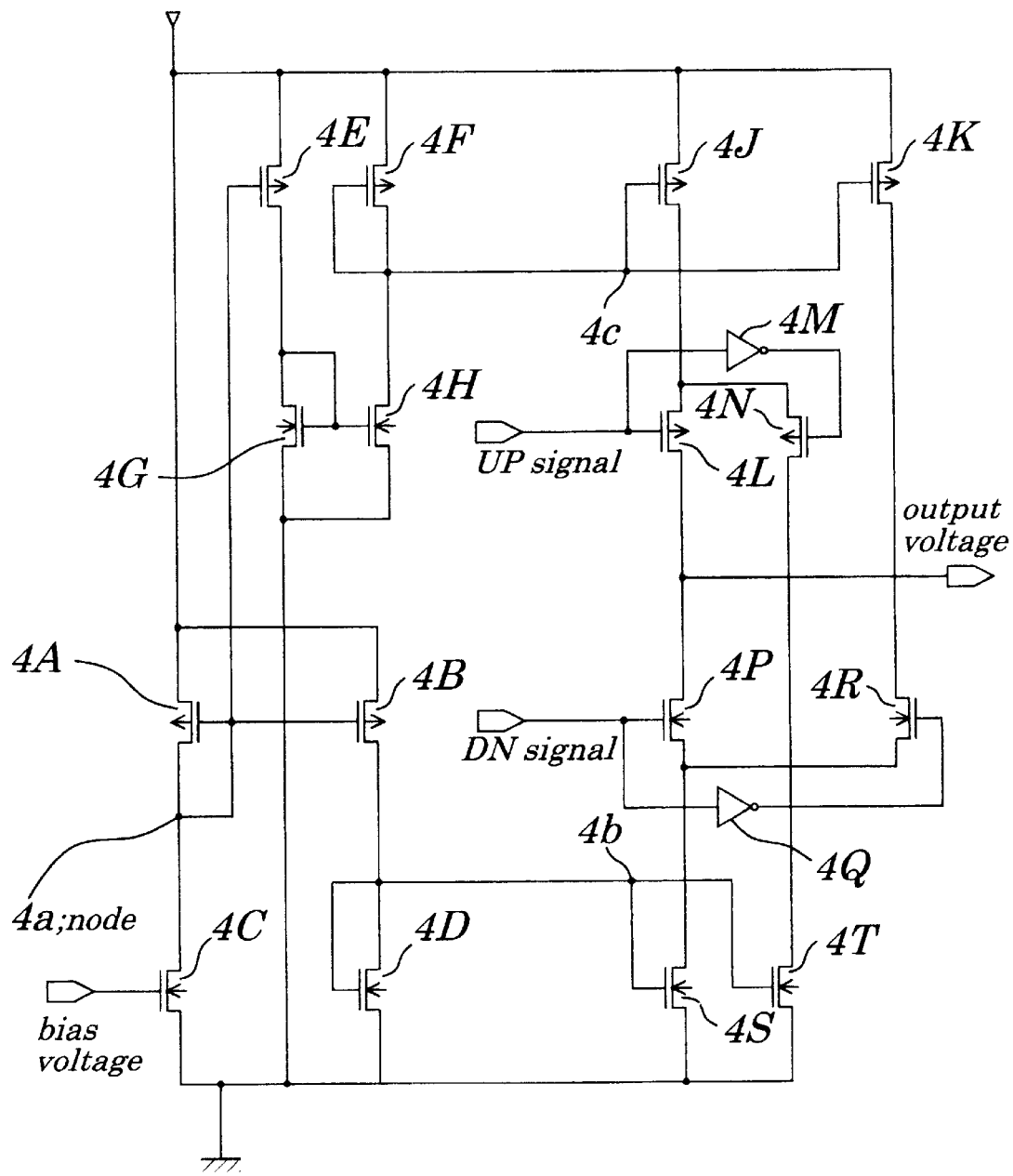
FIG. 7 is a circuit diagram exemplarily illustrating a charge pump of a volt rating circuit used for the clock regenerator.
Figure 8:
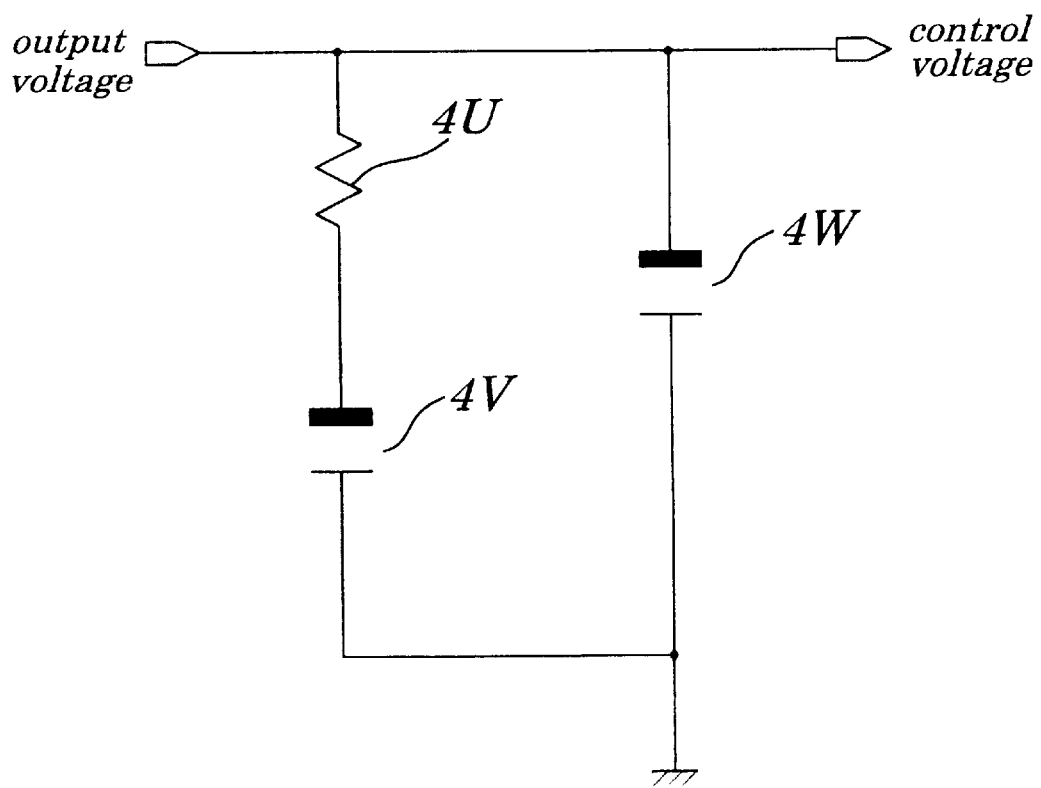
FIG. 8 is a view exemplarily illustrating a loop filter of the voltage generating circuit used for the clock regenerator.

The voltage generating circuit 4 generates control voltage based upon the UP signal and the DN signal from the selector 3. More specifically, the voltage generating circuit 4 once receiving the UP signal from the selector 3, generates high level control voltage, while receiving the DN signal, generates low level voltage. The voltage generating circuit 4 outputs the generated control voltage to the VCO 5. FIG. 7 and 8 exemplarily illustrate the voltage generating circuit 4 that generates the control voltage as described above.

More specifically, the voltage generating circuit 4 includes a charge pump illustrated in FIG. 7 and a loop filter illustrated in FIG. 8.

The charge pump includes as illustrated in FIG. 7 transistors 4A to 4H, 4J, 4K, 4L, 4N, 4P, 4R, 4S, 4T, and inverters 4m, 4q. The transistors 4A, 4B, 4E, 4F, 4J, 4K, 4L, 4N are a P (Positive) MOS (Metal Oxide Semiconductor) FET (Field Effect Transistor), while the transistors 4C, 4D, 4G, 4H, 4P, 4R, 4S, 4T are an N (Negative) MOS FET. Previously set bias voltage is inputted into the transistor 4C, which transistor 4C hereby flows a first set voltage in response to the bias voltage to bring a node 4a to first set voltage.

The transistors 4A, 4B form a current mirror circuit to conduct a current equal to the aforementioned first set current through the transistor 4D. The transistor 4D acts as resistance to bring the node 4b into first level voltage with the aid of the aforementioned first set current. The transistor 4E conducts a second set current in response to the aforementioned first set voltage. The transistors 4G, 4H constitute a current mirror circuit to conduct a current equal to the aforementioned second set current to the transistor 4F. The transistor 4F acts as resistance to bring the node 4c to second level voltage with the aid of the aforementioned second set current.

The transistors 4J, 4K serve to set voltage between a source and a drain in response to the aforementioned second level voltage, while the transistors 4S, 4T serve to set voltage between the drain and the source in response to the aforementioned first level voltage. A circuit composed of the transistors 4L, 4N and the inverter 4M acts to change over the magnitude of a current conducted through the transistors 4P, 4R in response to the aforementioned UP signal, and a circuit composed of the transistors 4P, 4R and the inverter 4Q acts to change over the magnitude of the current conducted through the transistor 4S in response to the aforementioned DN signal.

With the arrangement described above, the aforementioned charge pump supplies electric charges only during the time the aforementioned UP signal is at a low level. Further, it discharges electric charges only during the time the aforementioned DN signal is at a high level. Furthermore, when the UP signal is at a high level, and the DN signal is at a low level, electric charges are not charged or discharged and a voltage level just before is kept unchanged. The charge pump stores the electric charges thus generated on the aforementioned loop filter.

The loop filter includes a resistor 4U and capacitors 4V, 4W, as illustrated in FIG. 8. With such an arrangement the aforementioned loop filter generates the aforementioned control voltage excepting a sharp change in the aforementioned output voltage from the charge pump, and outputs generated control voltage to the VCO 5.

Figure 9:
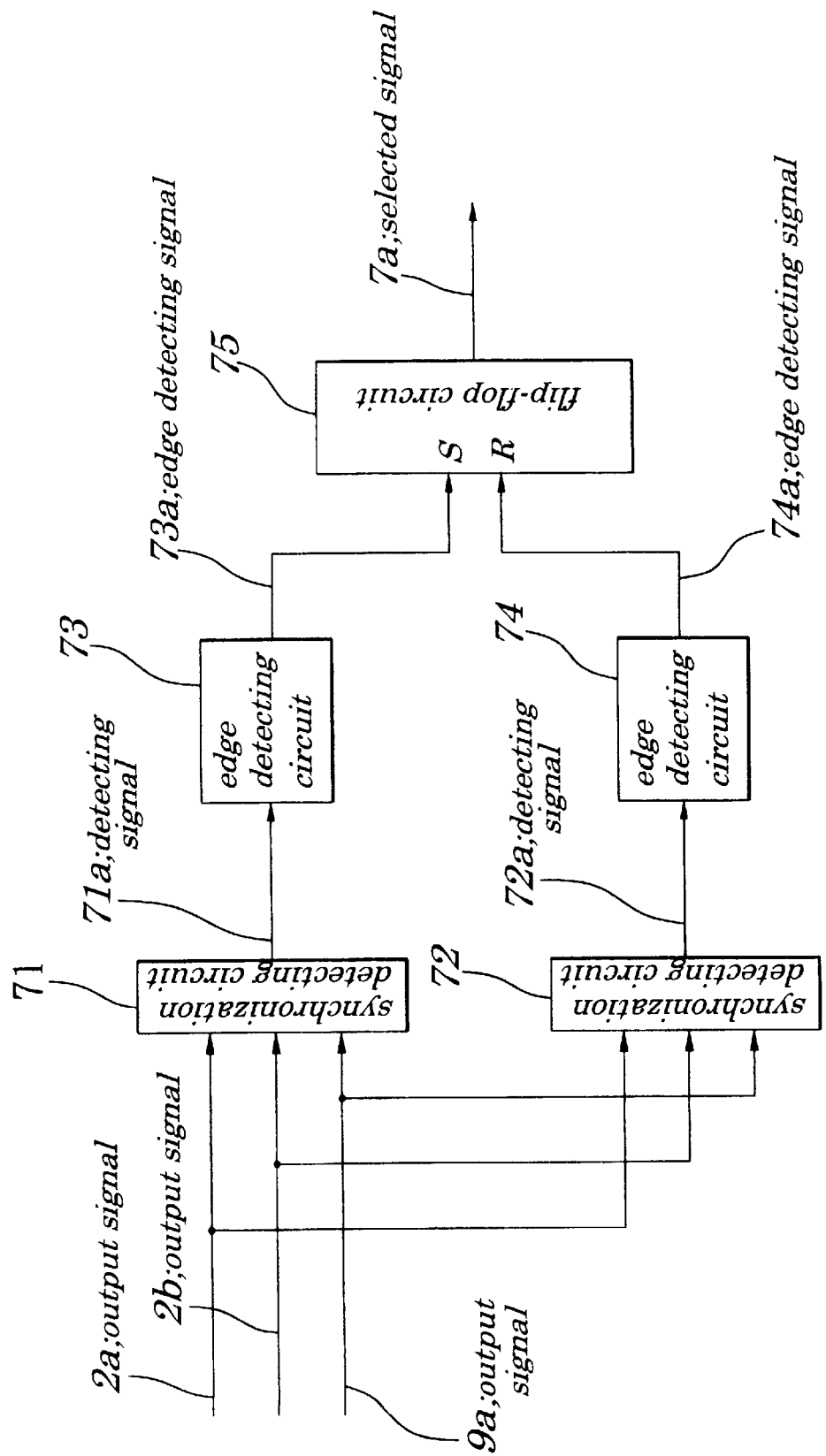
FIG. 9 is a circuit block diagram exemplarily illustrating a synchronization detecting section used for the clock regenerator.

The synchronization detecting section 7 generates the selected signal 7a based upon the output signals 2a, 2b from the phase/frequency comparator 2, and the output signal 9a from the selector 9. While the phase/frequency comparator 2 controls the operation such that the frequencies of the eighth-frequency signal 6b and the output signal 9a are coincident with each other, the synchronization detecting section 7 generates the low level selected signal 7a, and when the frequencies of the eighth-frequency signal 6b and the output signal 9a are coincident with each other, it generates the high level selected signal 7a. The synchronization detecting section 7 outputs the generated selected signal 7a to the selectors 3, 9. FIG. 9 exemplarily illustrates the synchronization detecting section 7.

The synchronization detecting section 7 in FIG. 7 includes synchronization detecting circuits 71, 72, edge detecting circuits 73, 74, and a flip-flop circuit 75.

Figure 10:
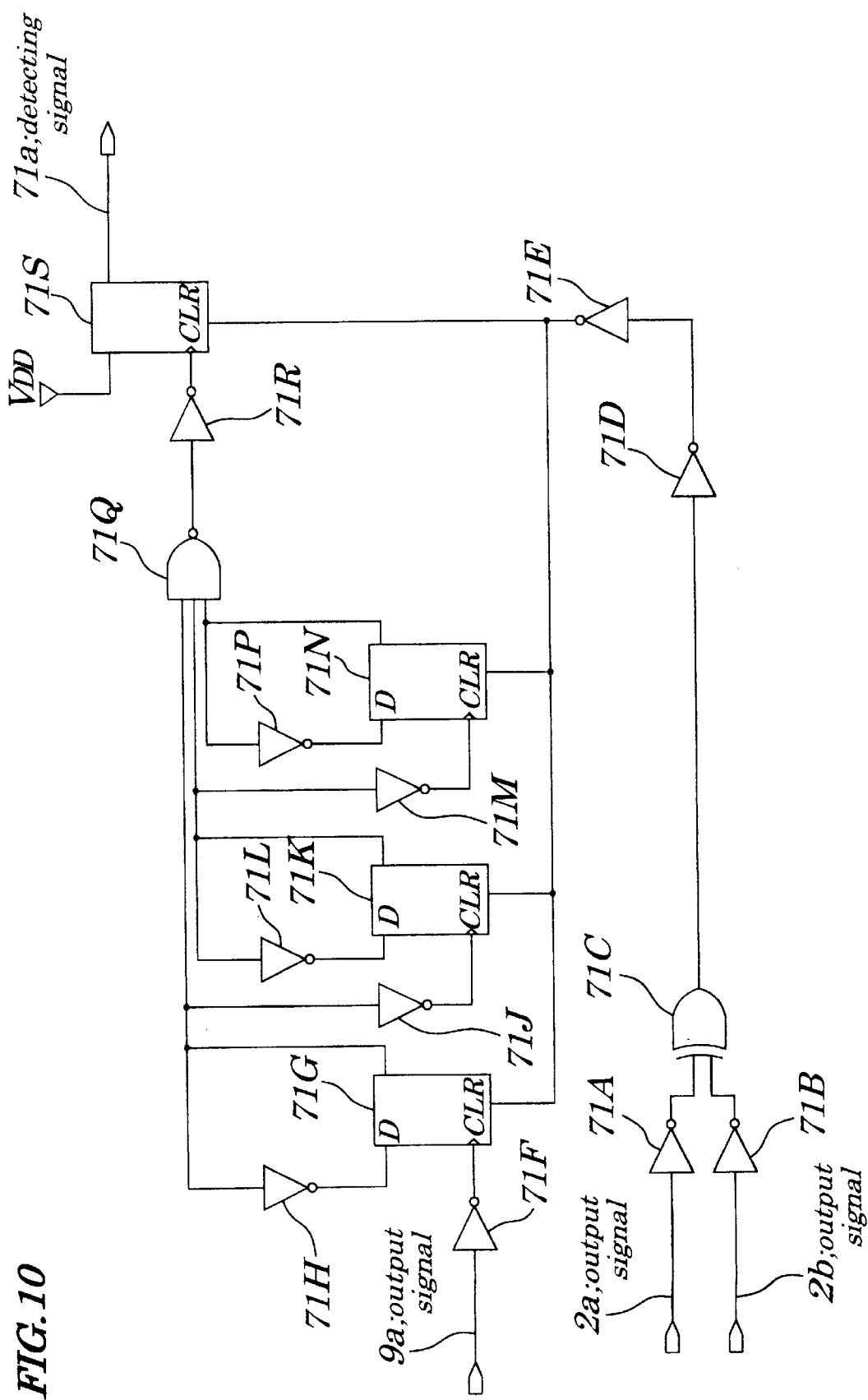
FIG. 10 is a circuit block diagram exemplarily illustrating the synchronization detecting circuit used for the clock regenerator.

The synchronization detecting circuit 71 generates a high level detecting signal when phases of the output signal 2a and of the output signal 2b are substantially coincident with each other for a predetermined time, and outputs the detecting signal to the edge detecting circuit 73. FIG. 10 exemplarily illustrates the synchronization detecting circuit 71.

The synchronization detecting circuit 71 includes inverters 71A, 71B, 71D, 71E, 71F, 71H, 71J, 71L, 71M, 71P, 71R, and an exclusive "or" circuit (hereinafter, simply referred to as an EOR.) 71C, flip-flops 71G, 71K, 71N, 71S, and further a NAND gate 71Q.

Figure 11:
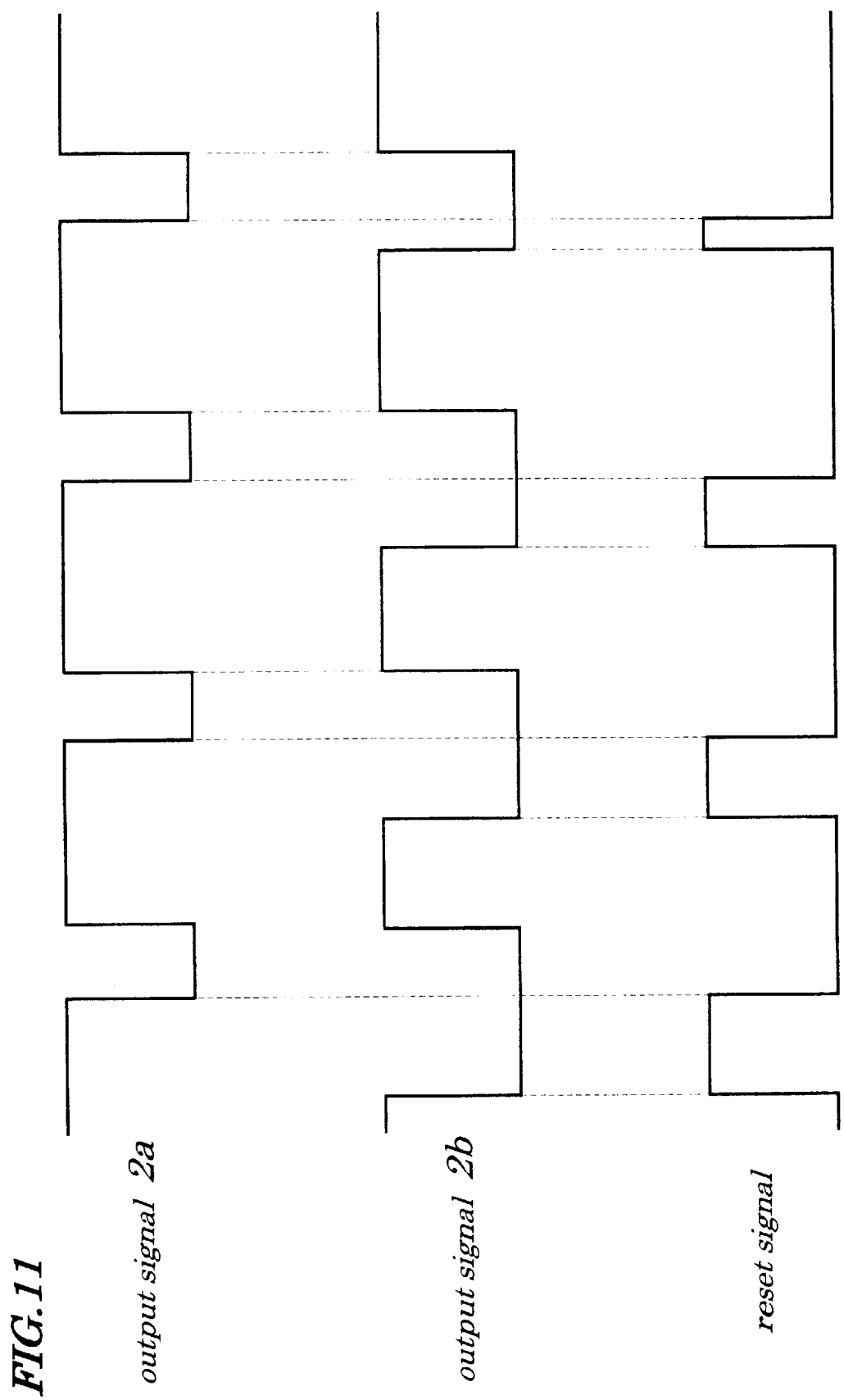
FIG. 11 is a view illustrating waveforms of operation of the synchronization detecting circuit used for the clock regenerator.

The inverters 71A, 71B, 71D, 71E, and an EOR 71C constitute a reset circuit, which generates a reset signal based upon the output signal 2a and the output signal 2b. More specifically, the EOR 71C calculates an exclusive "or" of the output signal 2a inverted in the inverter 71A and the output signal 2b inverted in the inverter 71B. Thus, when there are different a level of the output signal 2b and a level of the output signal 2b, as illustrated in FIG. 11, the EOR 71C generates a high level reset signal.

As described previously, the output signal 2a is generated on the basis of the output signal 9a that is used as a reference of the associated frequency, while the output signal 2b is generated on the basis of the eighth-frequency signal 6b, i.e., the clock signal c from the VCO 5. Hereby, when during the time the selector 9 selects the reference signal c as the output signal 9a, a deference is produced between the frequency of the reference signal b and the frequency of the eighth-frequency signal 6b, the aforementioned reset signal is generated. The EOR 71c outputs the generated reset signal to the flip-flops 71G, 71k, 71n, 71s after passage through the inverters 71D, 71E. The reference signal b is a signal that is used as a reference of the frequency generated with another device. The frequency of the reference signal b is 78 MHz.

Counter is constructed with the inverters 71F, 71H, 71J, 71L, 71M, 71P, and the flip-flops 71G, 71K, 71N. Each of the flip-flops 71G, 71K, 71N is a D type flip-flop, into a clear terminal CLR of each of which flip-flops the reset signal is inputted.

The output signal 9a is inputted into the clock terminal of the first stage flip-flop 71 of the aforementioned counter after passage through the inverter 71H. Further, an output of the flip-flop 71G is applied to an input terminal D of the flip-flop 71G after passage through the inverter 71H. Hereby, the flip-flop 71G inverts its output every time a pulse of the output signal 9a is inputted.

Into the clock terminal of the second stage flip-flop 71K of the aforementioned counter an output of the flip-flop 71G is inputted after passage through the inverter 71J. Further, an output of the flip-flop 71K is applied to the input terminal D of the flip-flop 71K after passage through the inverter 71L. Hereby, the flip-flop 71K inverts its output every time the output of the flip-flop 71G changes from a high to low level.

Into the clock terminal of the third stage flip-flop 71N of the aforementioned counter an output of the flip-flop 71K is inputted after passage through the inverter 71M. Further, an output of the flip-flop 71N is applied to the input terminal D of the flip-flop 71N after passage through the inverter 71P. Hereby, the flip-flop 71N inverts its output every time the output of the flip-flop 71k changes from a high level to a low level.

Accordingly, the outputs of the three stage flip-flops 71G, 71K, 71N change as follows every time a pulse of the output signal 9a is applied:

(1, 0, 0), (0, 1, 0), (1, 1, 0), . . . , (1, 1, 1)

The circuit composed of the NAND gate 71Q and the inverter 71R applies a high level signal to the flip-flop 71S when the outputs of the three stage flip-flops 71G, 71K, 71N become (1, 1, 1). In contrast, the aforementioned reset signal is inputted into the clear terminals CLR of the three stage flip-flops 71G, 71K, 71N. Therefore, provided the aforementioned reset signal is inputted into the flip-flops 71G, 71K, 71N before the output state of the flip-flops 71G, 71K, 71N reaches, the flip-flops 71G, 71K, 71N are reset. When the frequency of the eighth-frequency signal 6b is substantially coincident with the frequency of the reference signal b, pulse width of the reset signal is reduced, and hence the output state of the flip-flops 71G, 71K, 71N becomes (1, 1, 1) before the pulse of the reset signal is generated. Thus, the NAND gate 71Q and the inverter 71R apply an output to the flip-flop 71S, which output changes from a low level to a high level.

The output of the inverter 71R is applied to the clock terminal of the flip-flop 71S, and power supply voltage $V_{DD}$ is inputted into the input terminal D. Hereby, when the output from the inverter 71R changes from a low level to a high level after the reset signal from the reset circuit is inputted into the clear terminal CLR, the flip-flop 71S outputs a high level detecting signal 71a to the edge detecting circuit 7.

Thus, the synchronization detecting circuit 71 brings the detecting signal 71a to a high level only when the frequency of the eighth-frequency signal 6b is substantially coincident with the frequency of the reference signal b.

Figure 12:
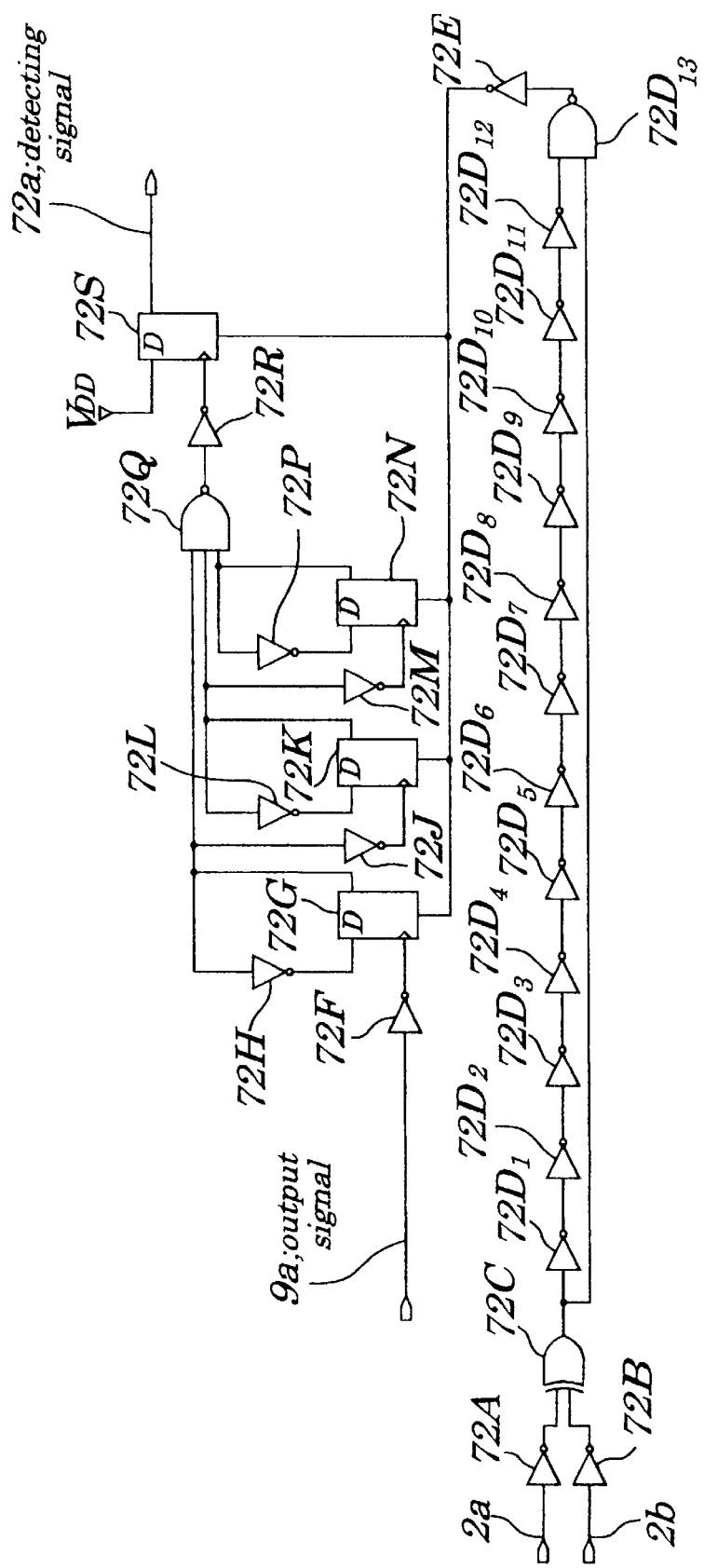
FIG. 12 is a circuit diagram exemplarily illustrating the synchronization detecting circuit used for the clock regenerator.

The detecting circuit 72 when there is continued for a predetermined time a state where the phase difference between the output signal 2a and the output signal 2b falls within a predetermined range, generates the high level detecting signal 72a, and outputs the detecting signal 72a to the edge detecting circuit 74. FIG. 12 exemplraily illustrates the synchronization detecting circuit 72.

The synchronization detecting circuit 72 in FIG. 12 includes inverters 72A, 72B, 72D$_1$ to 72D$_{12}$, 72E, 72F, 72H, 72J, 72L, 72M, 72P, 72R, an EOR 72C, a NAND gate 72D$_{13}$, flip-flops 72G, 72K, 72H, 72S, and a NAND gate 72Q.

Figure 13:
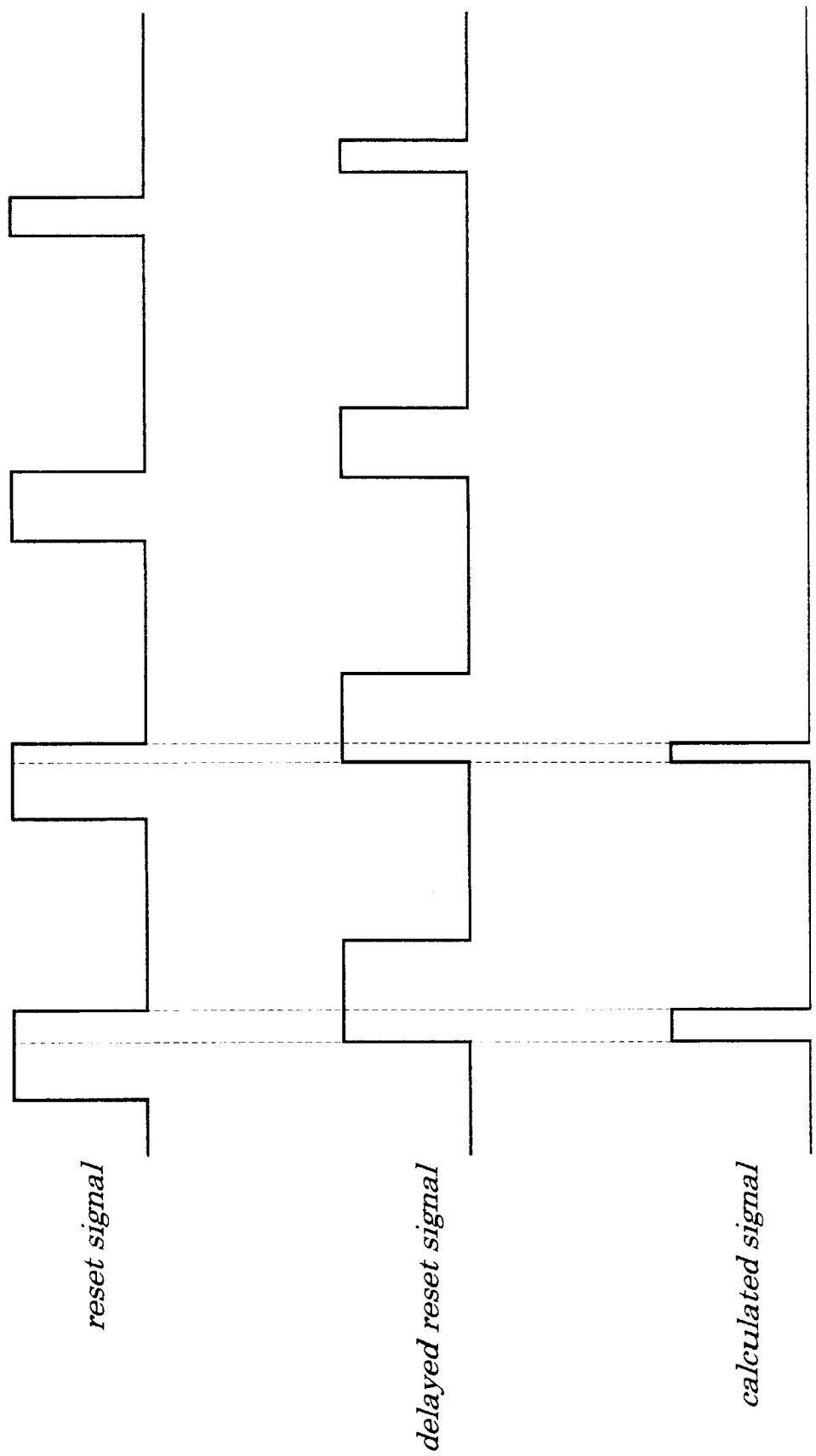
FIG. 13 is a view of waveforms illustrating the operation of the synchronization detecting circuit used for the clock regenerator.

The inverters 72A, 72B, 72D$_1$ to 72D$_{12}$, 72E, and the EOR 72C constitutes a reset circuit, which generates a reset signal based upon the output signal 2a and the output signal 2b. The inverters 72A, 72B and the EOR 72C generate a reset signal illustrated in FIG. 13 in the same manner as the inverters 71A, 71B of the synchronization detecting circuit 71 and the EOR 71C. The EOR 72C outputs the generated reset signal to the inverter 72D$_1$ and the NAND gate 72D$_{13}$.

The inverters 72D$_1$ to 72D$_{12}$ constitute a delay circuit. The delay circuit delays the reset signal by the number of the inverters 72D$_1$ to 72D$_{12}$, and generates a delayed reset signal illustrated in FIG. 13. The delay circuit inputs the delayed reset signal into the NAND gate 72D$_{13}$. The NAND gate 72D$_{13}$ calculates negation of logical product of the reset signal from the EOR 72C and the delayed reset signal from the reset circuit, and the inverter 72E contradicts a calculated result of the NAND gates 72D$_{13}$, and generates a calculated signal illustrated in FIG. 13. The inverter 72E outputs the calculated signal as a new reset signal to the flip-flops 72G, 72K, 72N, 72S.

The inverters 72F, 72H, 72J, 72L, 72M, 72P, and the flip-flops 72G, 72K, 72N constitutes a counter as in the inverters 71F, 71H, 71J, 71L, 71M, 71P and the flip-flops 71G, 71K, 71N of the synchronization detecting circuit 7.

When there is inputted the reset signal from the inverter 72E into the flip-flops 72G, 72K, 72N before the output state of the flip-flops 72G, 72K, 72N becomes (1, 1, 1), the flip-flops 72G, 72K, 72N are reset.

When the delay time defined by the delay circuit is long, the pulse width of the aforementioned new reset signal is reduced. As a result, only when the frequency of the eighth-frequency signal 6b is more sharply different from the frequency of the reference signal b, the pulse width of the aforementioned new reset signal is increased, and the flip-flops 72G, 72K, 72N are reset before the output state of the flip-flops 72G, 72K, 72N become (1, 1, 1). More specifically, the pulse width of the new reset signal is adjusted in response to time set by the aforementioned delay circuit. Thus, when the pulse width of the new reset signal is reduced, the output state of the flip-flops 72G, 72K, 72N becomes (1, 1, 1) before the pulse of the new reset signal is generated. As a result, the frequency of the eighth-frequency signal 6b is within a range set by the aforementioned delay time of the delay circuit with respect to the frequency of the reference signal b, the NAND gate 72Q and the inverter 72R apply the output that changes from a low level to a high level to the flip-flop 72S.

The flip-flop 72S outputs a high level detecting signal 72a to the edge detecting circuit 73 as in the case of the flip-flop 71S of the synchronization detecting circuit 71 when the output from the inverter 72R changes from a low level to a high level before the reset signal from the reset circuit is inputted into the clear terminal CLR.

Thus, the synchronization detecting circuit 72 brings the detecting signal 72a to a high level only when the frequency of the eighth-frequency signal 6b falls within the predetermined range.

The edge detecting circuit 73 detects a building-up edge of the detecting signal 71a, and outputs an edge detecting signal 7a indicative of the building-up edge to the flip-flop circuit 75.

Figure 14:
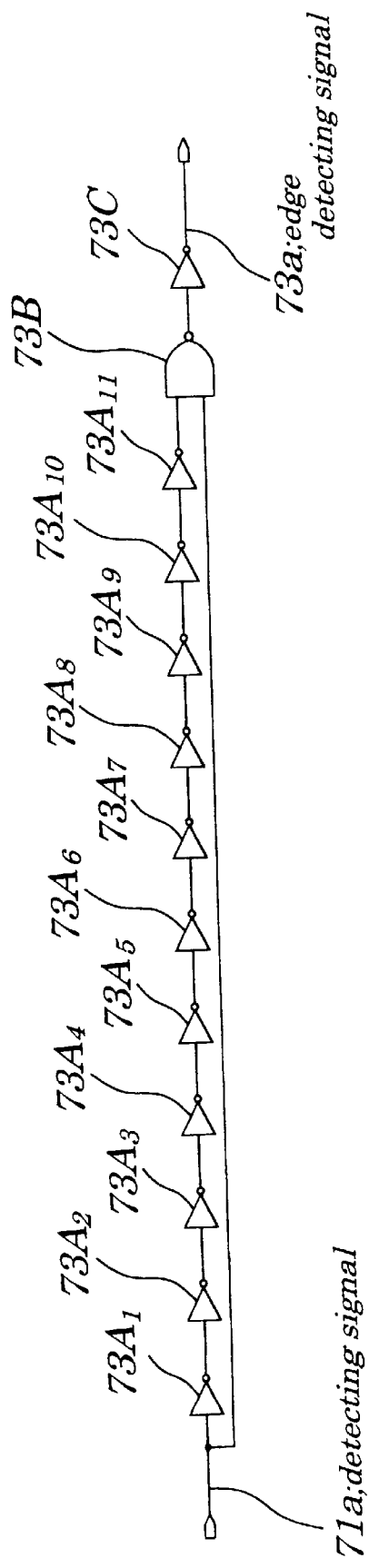
FIG. 14 is a circuit diagram exemplarily illustrating an edge detecting circuit used for the clock regenerator.

FIG. 14 exemplarily illustrates the edge detecting circuit 73. The edge detecting circuit 73 in FIG. 14 includes the inverters $73A_1$ to $73A_{11}$, 73C, and the NAND gate 73B.

Figure 15:
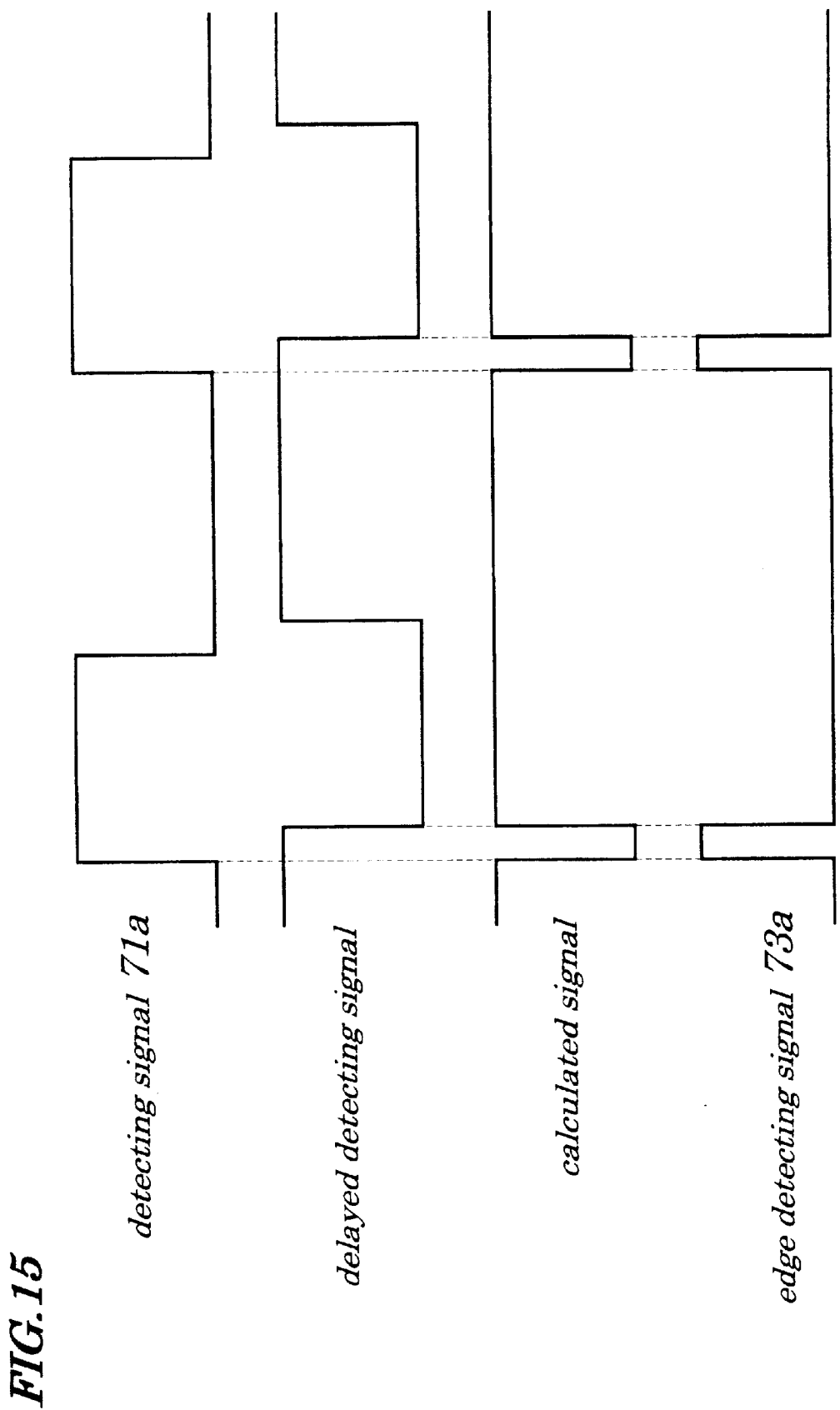
FIG. 15 is a view of waveforms illustrating operation of the edge detecting circuit used for the clock regenerator.

The inverters $73A_1$ to $73A_{11}$, constitute a delay circuit, which delays the detecting signal 71a as illustrated in FIG. 15 to form a delayed detecting signal. The delay circuit outputs the generated delayed detecting signal to the NAND gate 73B. The NAND gate 73B calculates negation of logical product of the detecting signal 71a and the delayed detecting signal to generate a calculation signal. The inverter 73C inverts the calculation signal to generate an edge detecting signal 73a, and outputs it to the flip-flop circuit 75.

Figure 16:
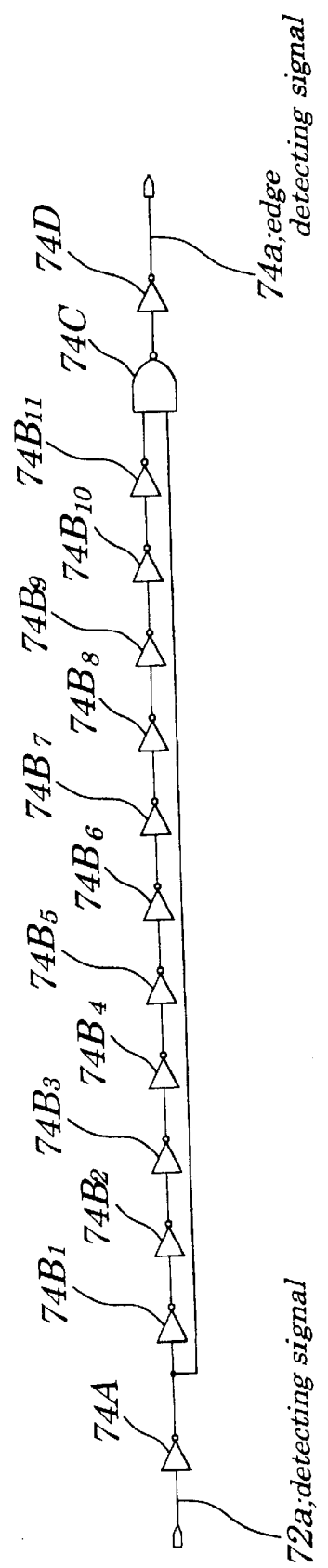
FIG. 16 is a circuit diagram exemplarily illustrating the edge detecting circuit used for the clock regenerator.

The edge detecting circuit 74 detects a trailing edge of the detecting signal 72a, and outputs an edge detecting signal 74a indicative of the trailing edge to the flip-flop circuit 75. FIG. 16 exemplarily illustrates the edge detecting circuit 74. The edge detecting circuit 74 illustrated in FIG. 16 includes inverters 74A, $74B_1$ to $74B_{11}$, 74D, and a NAND gate 74C.

Figure 17:
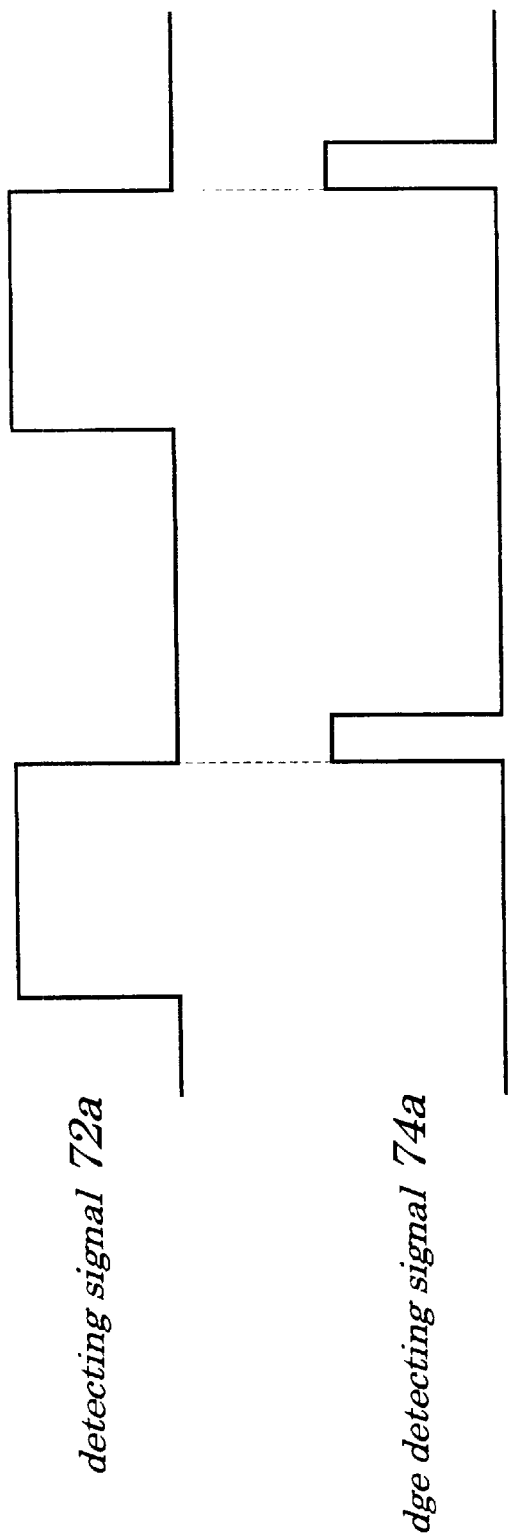
FIG. 17 is a view of waveforms illustrating an edge detecting signal generated from the edge detecting circuit used for the clock regenerator.

The inverter 74A inverts the detecting signal 72a, and inputs it into the inverter $74B_1$ and the NAND gate 74C. The inverters 74B. to $74B_1$, 74D, and the NAND gate 74C process a signal from the inverter 74A in the same fashion as the inverters $73A_1$ to $73A_{11}$, 73C, and the NAND gate 73B. The inverters 74B, to $74B_{11}$, 74D, and the NAND gate 74C generate the edge detecting signal 74a indicative of the trailing edge of the detecting signal 72a as illustrated in FIG. 17. The inverter 74D outputs the edge detecting signal 74a to the flip-flop circuit 75.

The flip-flop circuit 75 includes a set terminal S as an input terminal, and a reset terminal R as illustrated in FIG. 9. The edge detecting signal 73a from the edge detecting circuit 73 is inputted into the set terminal S, and the edge detecting signal 74a from the edge detecting circuit 73 is inputted into the reset terminal R. When the set terminal S becomes a high level, the flip-flop circuit 75 generates a high level selected signal 7a. When the reset terminal R becomes a high level, the flip-flop circuit 75 generates a low level selected signal 7a.

Figure 18:
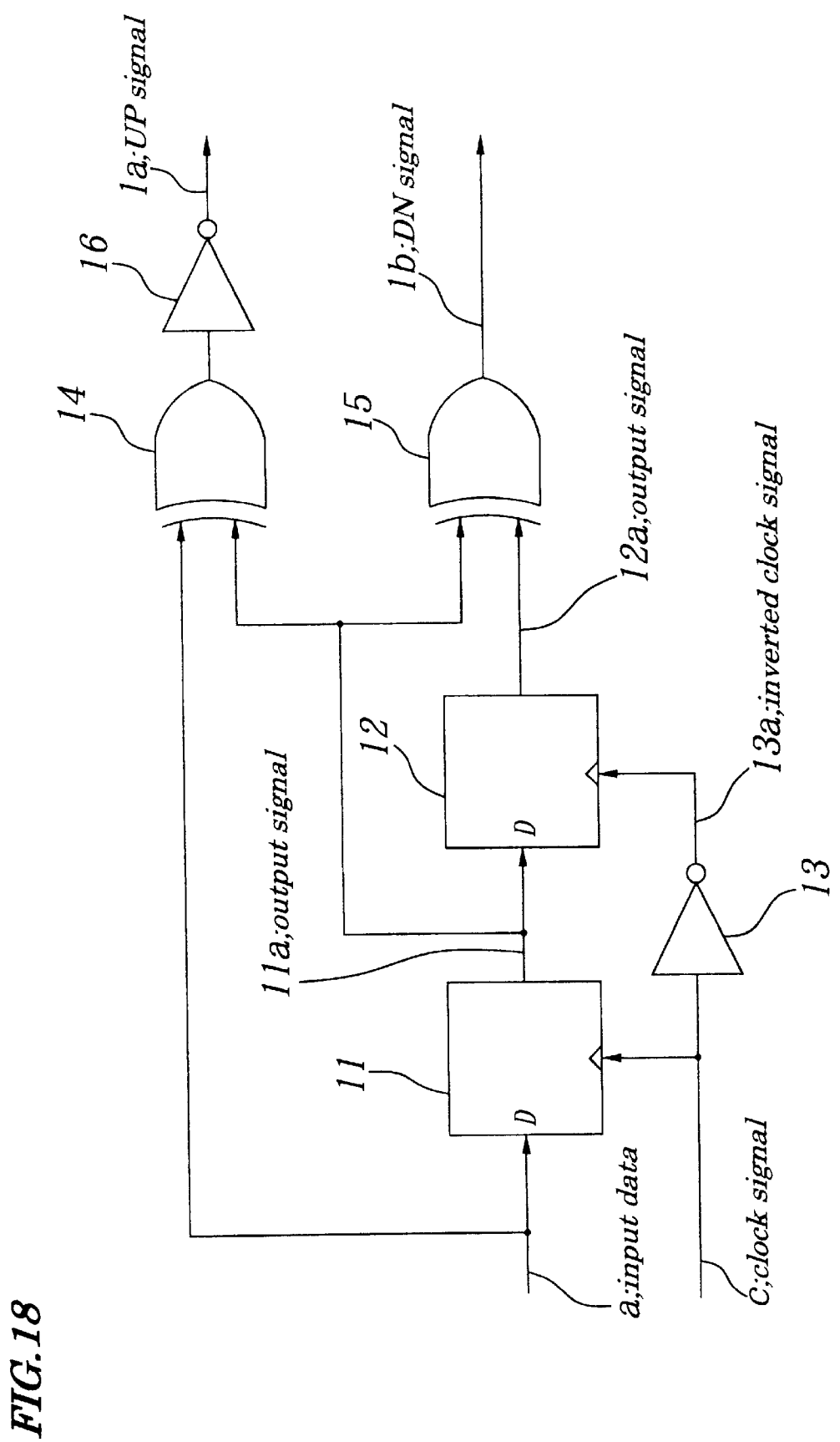
FIG. 18 is a circuit diagram exemplarily illustrating a phase comparator used for the clock regenerator.

The selector 9 executes selection operation based upon the selected signal 7a from the synchronization detecting section 7. More specifically, the selector 9 when the selected signal 7a is a high level, outputs the corrected reference signal 8a from the digital synchronous circuit 8 to the phase/frequency comparator 2 as the output signal 9a. Further, the selector 9 outputs the reference signal b to the phase/frequency comparator 2 as the output signal 9a when the selected signal 7a is a low level. The phase comparator 1 compares the phase of the clock signal c from the VCO 5 with the phase of the input data a, and generates an UP signal 1a and a DN signal 1B for correcting the phase difference on the basis of a compared result. The phase comparator 1 outputs the generated UP signal 1a and DN signal 1b to the selector 3. FIG. 18 exemplarily illustrates the selector.

Herein, the UP signal 1a is connected with a gate of a P type MOS FET of the charge pump circuit illustrated in FIG. 7 and with a gate of a P type MOS FET 4N through the inverter 4M, so that the UP signal 1a indicates a state where it is active upon a low level.

In contrast, the DN signal 1b is connected with a gate of an N type MOS FET 4P of the charge pump circuit illustrated in FIG. 7 and with a gate of an N type MOS FET 4R through the inverter 4Q, so that the DN signal 1b indicates a state where it is active upon a high level. The phase comparator 1 exemplarily illustrated in FIG. 18 is devised by Hogge, which includes flip-flops 11, 12, an inverter 13, and EORs 14, 15 (IEE TRANSACTIONS ON ELECTRON DEVICES, VOL.ED-32, No. 12, DEC. 1985 "A Self Correcting Clock Recovery Circuit" CHARLES R HOGGE, Jr).

The flip-flops 11, 12 are a D type flip-flop. The input data a is inputted into the input terminal D of the flip-flop 11, and the clock signal c from the VCO 5 is inputted into the clock terminal. The output signal 11a of the flip-flop 11 is inputted into the input terminal D of the flip-flop 12, and an inverted clock signal 13a obtained by inverting the clock signal c is inputted into the clock terminal through the inverter 13.

The EOR 14 calculates an exclusive "or" between the output signal 11a from the flip-flop 11 and the input data a to form the UP signal 1a. The EOR 15 calculates exclusive "or" between the output signal 11a from the flip-flop 11 and the output signal 12a from the flip-flop 12 to form the DN signal 1b. The phase comparator 1 is adapted such that the building-up edge of the clock signal is located at the center of the input data when the phase of the clock signal is in synchronism with the input data.

Figure 19:
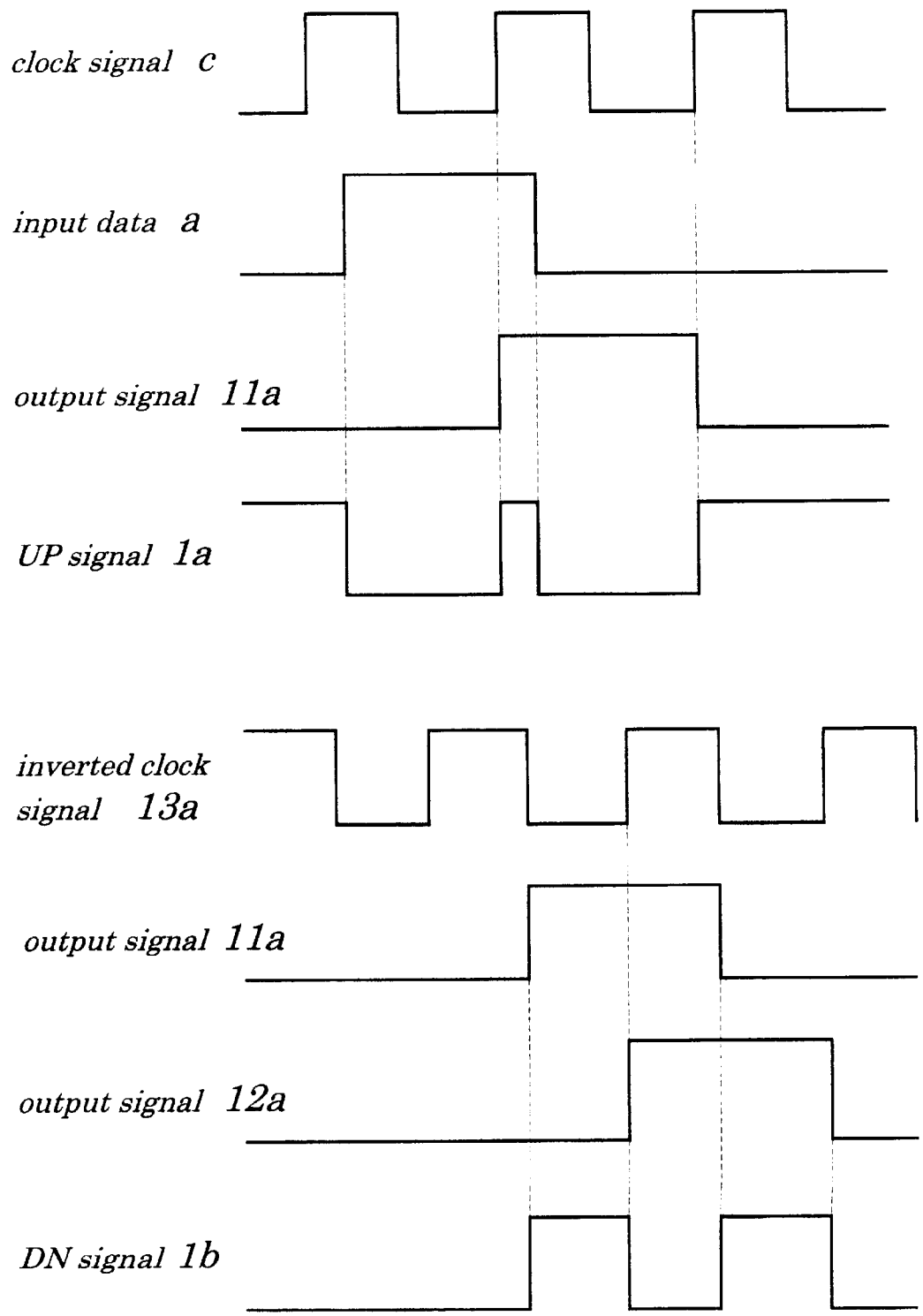
FIG. 19 is a view of waveforms each illustrating operation of the phase comparator used for the clock regenerator.
Figure 20:
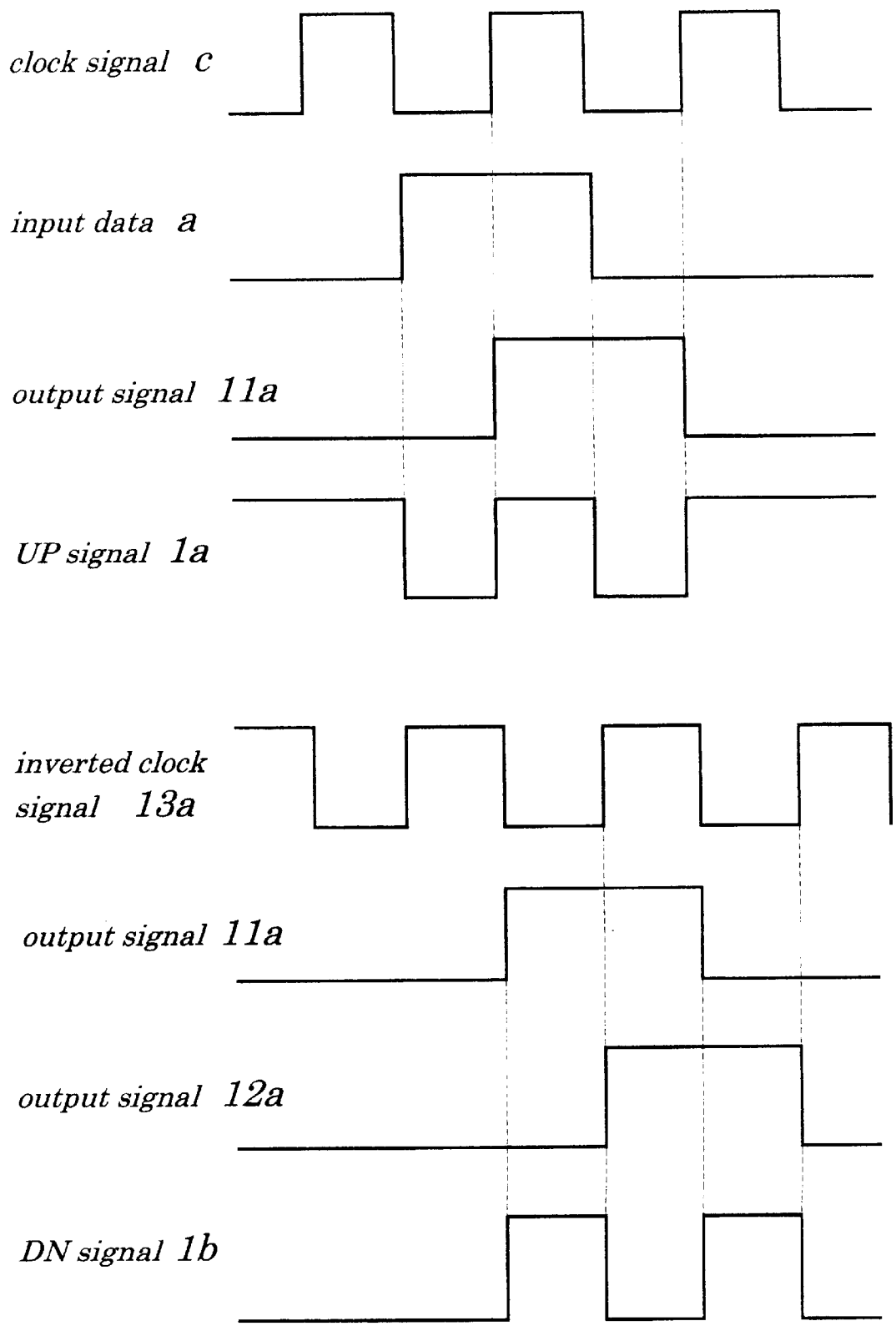
FIG. 20 is a view of waveforms illustrating the operation of the phase comparator used for the clock regenerator.
Figure 21:
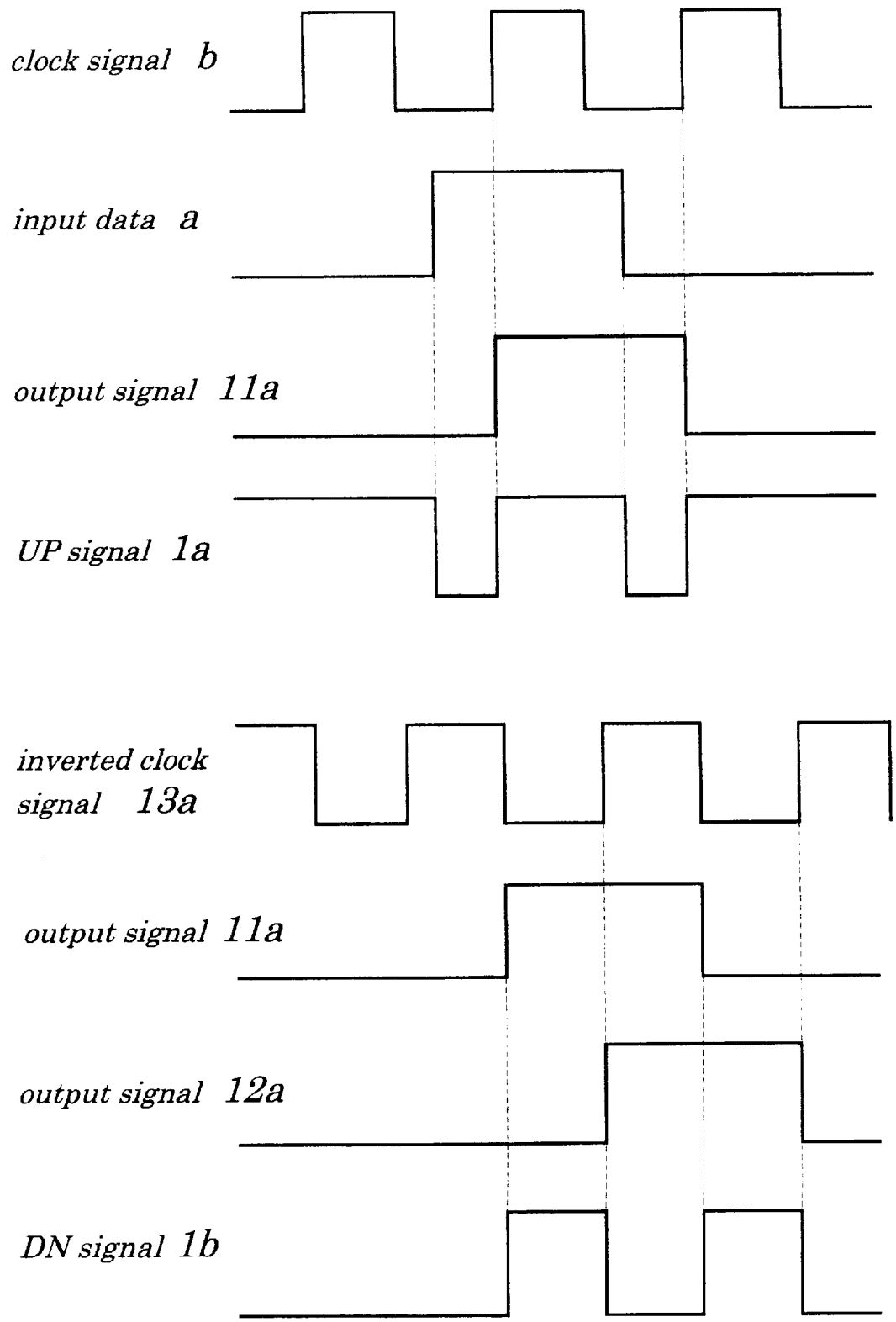
FIG. 21 is a view of waveforms illustrating the operation of the phase comparator used for the clock regenerator.

For example, when the phase of the clock signal c is more advanced than the input data a, waveforms of the output signal 11a, the inverted clock signal 13a, and the output signal 12a are as illustrated in FIG. 19. Compared with the DN signal 1b, the UP signal 1a having a wider downward pulse width is generated. Further, when as illustrated in FIG. 20, the phase of the clock signal c is in synchronism with the input data a, there is generated the UP signal 1a that is the same as the DN signal but has different phase pulse width. Further, when as illustrated in FIG. 21, the phase of the clock signal c is more delayed than the input data a, there is generated the UP signal 1a that has a narrower downward pulse width than the DN signal 1b. The UP signal 1a and DN signal 1b thus generated is outputted to the selector 3.

Figure 22:
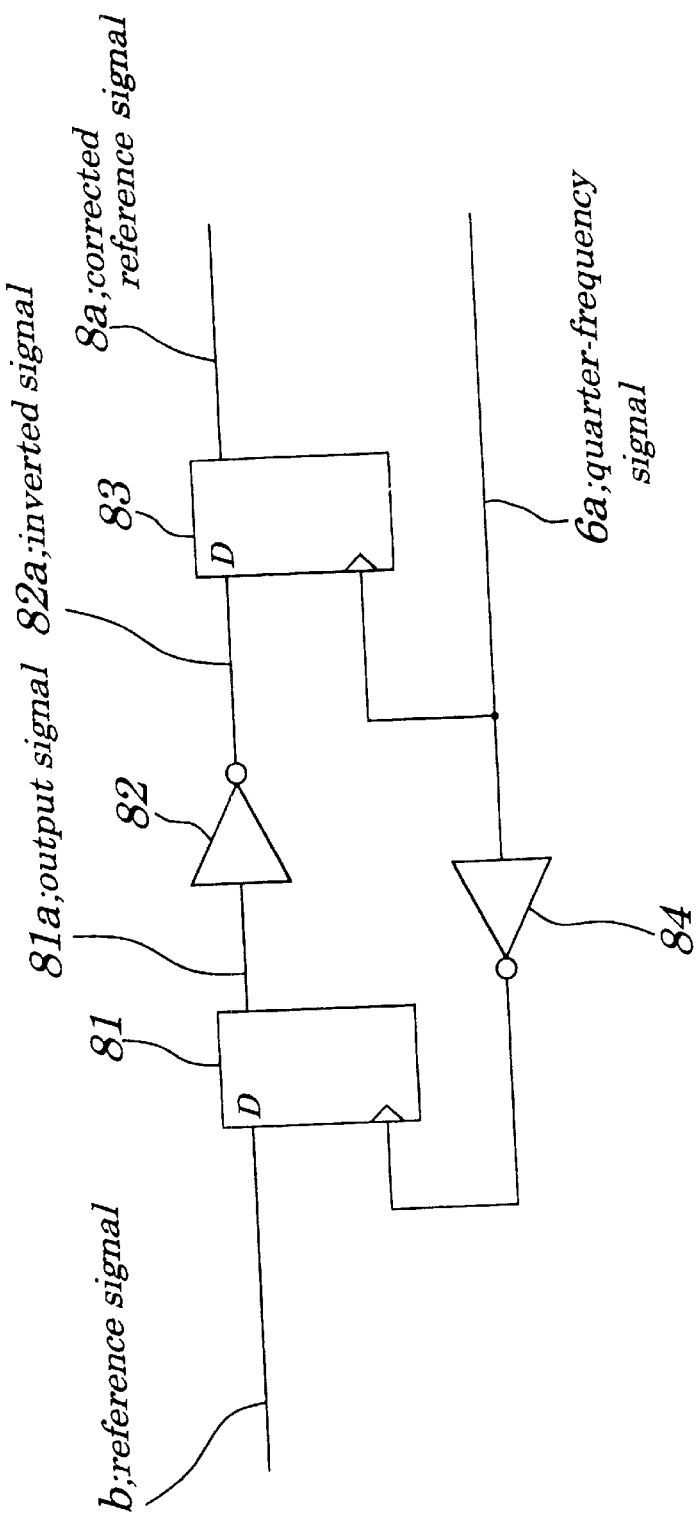
FIG. 22 is a circuit diagram exemplarily illustrating a digital synchronous circuit used for the clock regenerator.

The digital synchronizing circuit 8 executes synchronizing processing for bringing the phase of a quarter-frequency signal 6a from the frequency divider 6 and the phase of the reference signal b into coincidence when the clock signal; c outputted from the VCO 5 is in synchronism with the input data a. FIG. 22 exemplarily illustrates the digital synchronizing circuit 8.

The digital synchronizing circuit 8 in FIG. 22 includes flip-flops 81, 83, and inverters 82, 84.

The flip-flops 81, 83 are a D type flip-flop, into an input terminal of each of which the input data a is inputted and into a clock terminal of each of which the quarter-frequency signal 6a is inputted through the inverter 84. Into the input terminal D of the flip-flop 83 an output signal of the flip-flop 81 is inputted after passage through the inverter 82, and into the clock terminal the quarter-frequency signal 6a is inputted.

Figure 23:
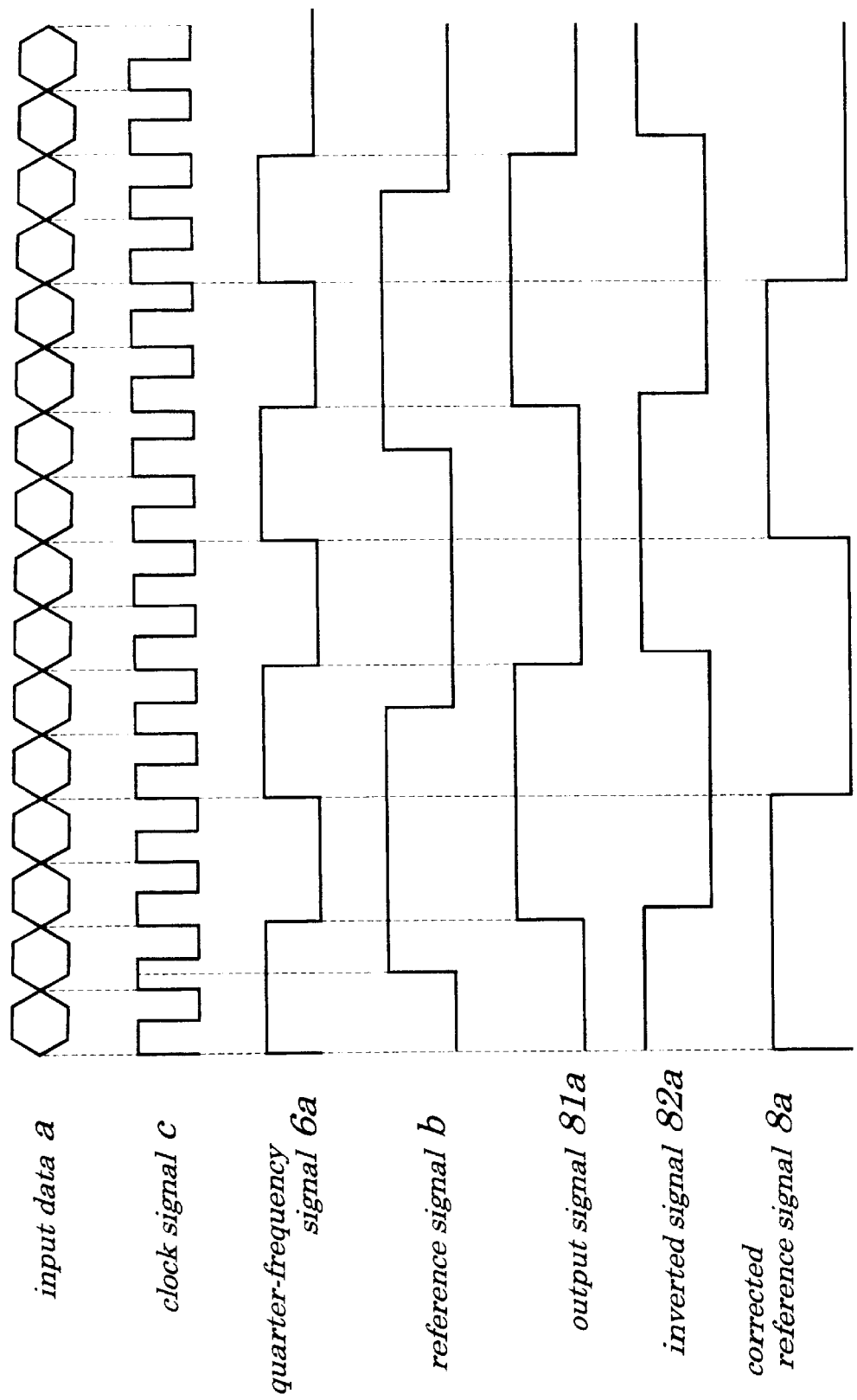
FIG. 23 is a view of waveforms each for illustrating operation of the digital synchronous circuit used for the clock regenerator.

When the phase of the reference signal b is not coincident with the phase of the clock signal c generated on the basis of the input data a as illustrated in FIG. 23, the digital synchronizing circuit 8 brings the phase of the reference signal b into coincidence with the phase of the clock signal c as follows. More specifically, an inverted signal of the quarter-frequency signal 6a is inputted into the clock terminal of the flip-flop 81, so that the flip-flop 81 incorporates the input data a at a trailing edge of the quarter-frequency signal 6a. Hereby, the flip-flop 81 generates an output signal 81a in which the reference signal b is brought into synchronism with the trailing edge of the quarter-frequency signal 6a. The flip-flop 81 outputs the generated output signal 81a to the inverter 82.

The inverter 82 outputs an inverted signal 82a generated by inverting the output signal 81a to the flip-flop 83.

Since the quarter-frequency signal 6a is inputted into the clock terminal of the flip-flop 83, the flip-flop 83 incorporates the inverted signal 82a at the building-up edge of the quarter-frequency signal 6a. As a result, a corrected reference signal 8a illustrated in FIG. 23 is generated in which signal 8a the reference signal b is in synchronism with the building-up of the quarter-frequency signal 6a.

The digital synchronizing circuit 8 outputs the corrected reference signal 8a to the selector 9 in which the phase of the reference signal b is brought into coincidence with the phase of the quarter-frequency signal 6a.

In the following, operation of the present preferred embodiment will be described.

When the frequency of the clock signal c is different from the reference signal b, the phase/frequency comparator 2 outputs output signals 2a, 2b having different duty ratios to the synchronizing detecting section 7. The synchronizing detecting section 7 outputs a low level selected signal 7a to the selectors 9, 3 through the output signals 2a, 2b. The selector 3 outputs the UP signal 2c and the DN signal 2d from the phase/frequency comparator 2 to the voltage generating circuit 4 through the selected signal 7a, and the selector 9 outputs the reference signal b to the phase/frequency comparator 2 as the output signal 9a.

The voltage generating circuit 4 generates control voltage based upon the UP signal 2c and the DN signal 2d. The VCO 5 generates and outputs the clock signal c with a frequency in response to the aforementioned control voltage. The frequency divider 6 divides the frequency of the clock signal c in eighth to generate the eighth-frequency signal 6b, and outputs the eighth-frequency signal 6b to the phase/frequency comparator 2. The phase/frequency comparator 2 once receiving the reference signal b and the eighth-frequency signal 6b, generates the UP signal 2c and the DN signal 2d such that the frequencies of the eighth-frequency signal 6b is coincident with the frequency of the reference signal b, and outputs them to the voltage generating circuit 4 through the selector 3.

Figure 24:
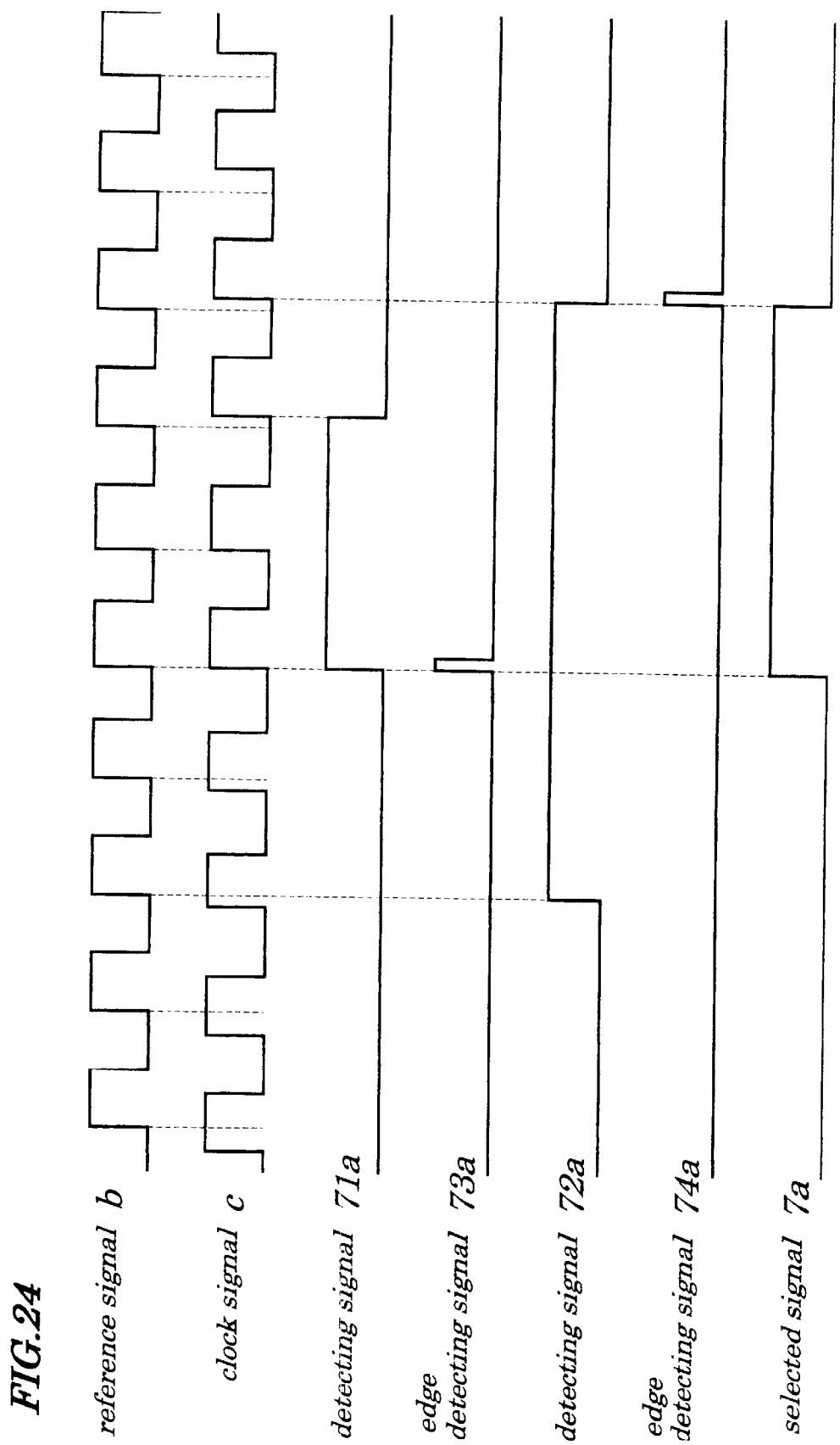
FIG. 24 is a view of waveforms each illustrating operation of the clock regenerator.

When the frequency of the clock signal c thus generated approaches the reference signal b as illustrated in FIG. 24, the phase/frequency comparator 2 outputs to the synchronization detecting section 7 the output signals 2a, 2b having duty ratios that mutually approach. The synchronization detecting circuit 71 of the synchronization detecting section 7 brings the detecting signal 71a from a low level to a high level through the output signals 2a, 2b and the reference signal b from the selector 9, as illustrated in FIG. 24. The synchronization detecting circuit 71 outputs the detecting signal 71a to the edge detecting circuit 73. The edge detecting circuit 73 detects building-up of the detecting signal 71a, and outputs the edge detecting signal 73a to the flip-flop circuit 75, as illustrated in FIG. 24. The flip-flop circuit 75 outputs a high level selected signal 7a through the edge detecting signal 73a, as illustrated in FIG. 24.

When the selected signal 7a becomes a high level, the selector 3 outputs the UP signal 1a and the DN signal 1b from the phase comparator 1 to the voltage generating circuit 4. There is accordingly formed a loop where those signals are returned again to the phase comparator 1 after passage through the voltage generating circuit 4 and the VCO 5 from the phase comparator 1, whereby phase of the clock signal c outputted from the VCO 5 is brought into coincidence with phase of the input data a.

In contrast, the selector 9 outputs a corrected reference signal 8a from the digital synchronizing circuit 8 to the phase/frequency comparator 2 through the high level selected signal 7a. The selector 9 outputs the corrected reference signal 8a from the digital synchronizing circuit 8 to the phase/frequency comparator 2 through the selected signal 7a. Herein, although the phase/frequency comparator 2 and the digital synchronizing circuit 8 are not associated with the generation of the clock signal c, the phase/frequency comparator 2 monitors a change in the frequency of the clock signal c. Upon the monitoring of the frequency the phase/frequency comparator 2 employs the output signal 9a from the selector 9, i.e., the corrected reference signal 8a from the digital synchronizing circuit 8 as a reference.

In contrast, the digital synchronizing circuit 8 matches the phase of the reference signal b with that of the VCO 5. Since the phase of the reference signal b is coincident with that of the input data a, the phase of the reference signal b is coincident with that of the input data a. Hereby, the phase/frequency comparator 2 monitors the clock signal c outputted from the VCO 5 on the basis of the reference signal b having its phase and frequency equal to the input data a.

Thereafter, when the frequency of the clock signal c outputted from the VCO 5 is sharply changed owing to any cause, the phase/frequency comparator 2 outputs the output signals 2a, 2b having different duty ratios to the synchronization detecting section 7. The synchronization detecting circuit 72 of the synchronization detecting section 7 brings the detecting signal 72a from a high level to a low level through the output signals 2a, 2b as illustrated in FIG. 24, and outputs it to the edge detecting circuit 74. The edge detecting circuit 74 detects trailing edge of the synchronization detecting circuit 72, and outputs the edge detecting signal 74a to the flip-flop circuit 75 as illustrated in FIG. 24. The flip-flop circuit 75 outputs the low level selected signal 7a through the edge detecting signal 74a as illustrated in FIG. 24.

Hereby, there is formed a loop which passes through the voltage generating circuit 4 and the VCO 5 from the phase/frequency comparator 2 again to the VCO 5, and hence the VCO 5 outputs the clock signal c having frequency coincident with the phase of the reference signal b.

With the present preferred embodiment, the clock signal c is brought into synchronism with the input data a, and then the clock signal c is monitored on the basis of the reference signal b having the frequency and phase coincident with those of the input data a, so that it is possible to accurately investigate a change in the clock signal c.

Further, since the clock signal is generated on the basis of the frequency and the phase, there is prevented generation of the clock signal c due to harmonics, i.e., the clock signal c having frequency substantially multiple times the input data a, or the clock signal c having frequency substantially one to multiples.

Second Embodiment

In the following, there will be described a second preferred embodiment of the present invention.

Figure 25:
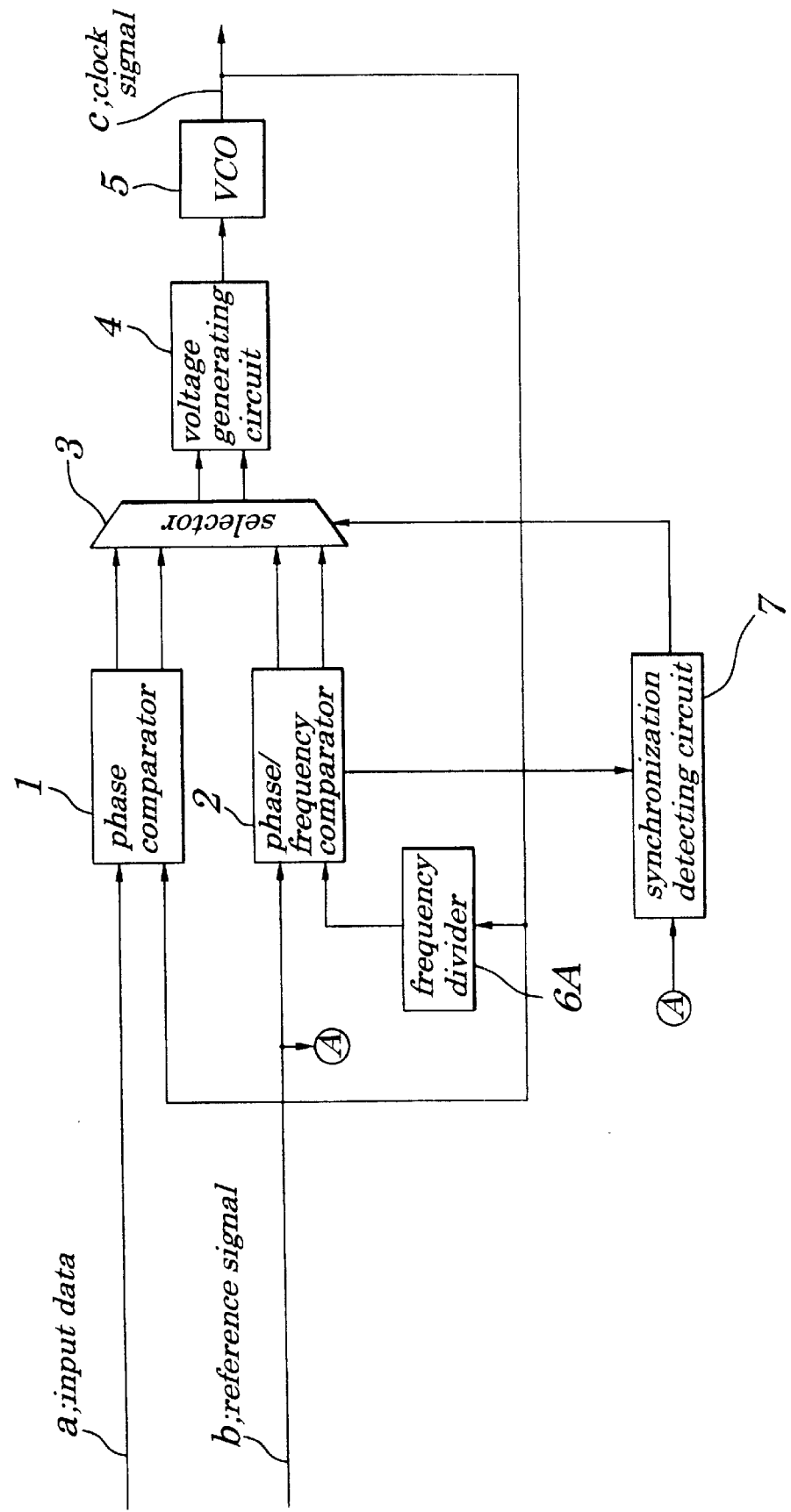
FIG. 25 is a circuit block diagram schematically illustrating construction of the clock regenerator according to a second preferred embodiment of the present invention.
Figure 26:
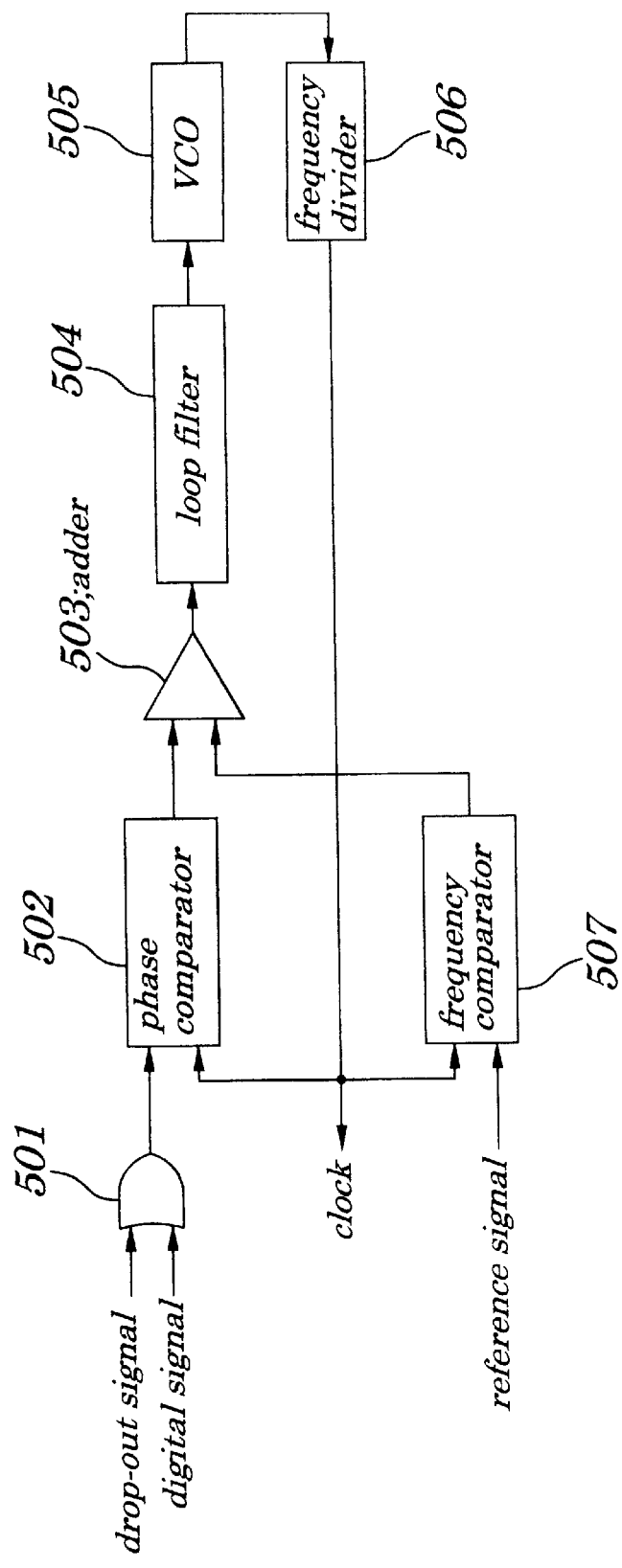
FIG. 26 is a circuit block diagram illustrating a prior art clock extraction circuit.

Referring to FIG. 25, a block diagram of an arrangement of the clock regenerator being the second embodiment of the present invention is schematically illustrated. Like symbols in FIG. 25 shall be also applied to those of like members in FIG. 1, and description thereof will be omitted.

In the second preferred embodiment, a frequency divider 6A is used instead of the frequency divider in FIG. 1. The frequency divider 6A generates only the eighth-frequency signal obtained by dividing the frequency of the clock c in eighth. The 8 frequency division signal is outputted to the phase/frequency comparator 2 as in the frequency divider 6 illustrated in FIG. 1. Further, there are eliminated the digital synchronizing circuit 8 and the selector 9. More specifically, the frequency of the clock signal c is brought into coincidence with the reference signal b with the aid of the phase/frequency comparator 2, and then the phase of the clock signal c is brought into contact with the input data a with the aid of the phase comparator 1.

In such a manner, the frequency and the phase of the clock signal c are brought into coincidence with those of the input data a.

The clock signal c can keep a state synchronized with the input data a provided a level of the input data a is a signal changing at all times, so that a simple clock regenerator eliminating the digital synchronizing circuit 8 and the selector 9 is ensured.

It is apparent that the present invention is not limited to the above embodiments but may be changed and modified without departing from the scope and spirit of the invention. For example, the phase comparator 1 and the phase/frequency comparator 2 are not limited to those with the arrangement of FIGS. 18 and 2.

Further, the synchronization detecting section 7 and the digital synchronous circuit 8 may be constructed using another type of FETs and bipolar transistors.

Finally, the present application claims the priority of Japanese Patent Application No. Hei10-227780 filed on Aug. 12, 1998, which is herein incorporated by reference.

What is claimed is:

1. A clock regenerator comprising:

an oscillating means for outputting a clock signal with a frequency in response to an inputted first or second comparison signal;

a first generating means for comparing the frequency of an inputted reference signal with that of said clock signal, and generating said first comparison signal in response to a frequency difference between the frequency of said inputted reference signal and that of said clock signal;

a second generating means for comparing the phase of a digital input data with that of said clock signal, and generating said second comparison signal in response to a phase difference between the phase of said digital input data and that of said clock signal;

a first changeover means for selecting either said first comparison signal fed from said first generating means or said second comparison signal fed from said second generating means, and outputting a selected signal to said oscillating means; and a controlling means for investigating whether or not a frequency difference between the frequency of said reference signal and that of said clock signal falls within a predetermined range, and controlling said first changeover means, when said frequency difference is outside said predetermined range, such that said first comparison signal generated by said first generating means is selected, while controlling said first changeover means, when said frequency difference falls within said predetermined range, such that said second comparison signal generated by said second generating means is selected.

2. The clock regenerator according to claim 1, wherein said oscillating means includes a voltage generating circuit for generating control voltage based upon said inputted first or second comparison signal and a voltage controlled oscillator for generating and outputting a clock signal with a frequency in response to said control voltage applied from said voltage generating circuit.

3. The clock regenerator according to claim 1, wherein said controlling means investigates, based upon a comparison result of said first generating means, whether or not said frequency difference between the frequency of said reference signal and that of said clock signal falls within a predetermined range.

4. The clock regenerator according to claim 1, further comprising:

a correcting means for generating a corrected reference signal by means of matching the phase of a predetermined reference signal with a predetermined frequency to the phase of said clock signal fed from said oscillating means;

a second changeover means for selecting either said corrected reference signal fed from said correcting means or said predetermined reference signal, and thus outputting a selected signal as said reference signal to said first generating means; and said controlling means for controlling said second changeover means so as to select said predetermined reference signal when said frequency difference is out of said predetermined range, while controlling said second changeover means so as to select said corrected reference signal when said frequency difference falls within said predetermined range.

5. The clock regenerator according to claim 1, wherein said first generating means compares the frequency of said clock signal obtained by dividing, using a frequency divider, the frequency of said clock signals fed from said oscillating means with that of said reference signal.

6. The clock regenerator according to claim 4, wherein said correcting means generates said corrected reference signal by means of matching the phase of said predetermined reference signal with said pre-determined frequency to the phase of said clock signal obtained by dividing, using said frequency divider, the frequency of said clock signals fed from said oscillating means.

7. A clock regenerator comprising:

an oscillating means for outputting a clock signal with a frequency in response to an inputted first or second comparison signal;

a first generating means for comparing the frequency of an inputted reference signal with that of said clock signal, and generating said first comparison signal in response to a frequency difference between the frequency of said inputted reference signal and that of said clock signal;

a second generating means for comparing the phase of a digital input data with that of said clock signal, and generating said second comparison signal in response to a phase difference between the phase of said digital input data and that of said clock signal;

a first changeover means for selecting either said first comparison signal fed from said first generating means or said second comparison signal fed from said second generating means, and outputting a selected signal to said oscillating means; and a controlling means for investigating whether or not a frequency difference between the frequency of said reference signal and that of said clock signal falls within a first or a second predetermined range, and controlling said first changeover means, when said frequency difference is outside said first predetermined range, such that said first comparison signal generated by said first generating means is selected, while controlling said first changeover means, when said frequency difference falls within said second predetermined range, such that said second comparison signal generated by said second generating means is selected.

8. The clock regenerator according to claim 7, wherein said oscillating means includes a voltage generating circuit for generating control voltage based upon said inputted first or second comparison signal and a voltage controlled oscillator for generating and outputting a clock signal with a frequency in response to said control voltage applied from said voltage generating circuit.

9. The clock regenerator according to claim 7, wherein said controlling means investigates, based upon a comparison result of said first generating means, whether or not said frequency difference between the frequency of said reference signal and that of said clock signal falls within said first or said second predetermined range.

10. The clock regenerator according to claim 7, further comprising:

a correcting means for generating a corrected reference signal by means of matching the phase of a predetermined reference signal with a predetermined frequency to the phase of said clock signal fed from said oscillating means;

a second changeover means for selecting either said corrected reference signal fed from said correcting means or said predetermined reference signal, and thus outputting a selected signal as said reference signal to said first generating means; and said controlling means for controlling said second changeover means so as to select said predetermined reference signal when said frequency difference is out of said first predetermined range, while controlling said second changeover means so as to select said corrected reference signal when said frequency difference falls within said second predetermined range.

11. The clock regenerator according to claim 7, wherein said first generating means compares the frequency of said clock signal obtained by dividing, using said frequency divider, the frequency of said clock signals fed from said oscillating means with that of said reference signal.

12. The clock regenerator according to claim 10, wherein said correcting means generates said corrected reference signal by means of matching the phase of said predetermined reference signal with said pre-determined frequency to the phase of said clock signal obtained by dividing, using said frequency divider, the frequency of said clock signals fed from said oscillating means.

13. A clock regenerator comprising:

means for generating a first comparison signal in response to a frequency difference between the frequency of an inputted reference signal and that of a clock signal so as to obtain said clock signal with the frequency in response to said first comparison signal, and thereafter generating a second comparison signal in response to a phase difference between a phase of digital input data and that of said clock signal so as to obtain said clock signal in response to said second comparison signal.

14. A clock regenerator comprising:

means for changing operation from clock synchronization due to frequency comparison to clock synchronization due to phase comparison when a frequency difference between the frequency of an inputted reference signal and that of a clock signal falls within a first predetermined range, while changing operation from clock synchronization due to said phase comparison to clock synchronization due to said frequency comparison when said frequency difference between the frequency of said inputted reference signal and that of said clock signal is out of a second predetermined range including said first predetermined range.

* * * * *